United States Patent
Kawai et al.

(10) Patent No.: US 9,494,964 B2
(45) Date of Patent: Nov. 15, 2016

(54) GATE DRIVE CIRCUIT

(71) Applicant: Panasonic Intellectual Property Management Co., Ltd., Osaka (JP)

(72) Inventors: Yasufumi Kawai, Osaka (JP); Shuichi Nagai, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/702,132

(22) Filed: May 1, 2015

(65) Prior Publication Data
US 2015/0234417 A1 Aug. 20, 2015

Related U.S. Application Data

(63) Continuation of application No. PCT/JP2014/004201, filed on Aug. 18, 2014.

(30) Foreign Application Priority Data

Aug. 27, 2013 (JP) .................................. 2013-176167

(51) Int. Cl.
*H03K 3/00* (2006.01)
*G05F 5/00* (2006.01)
(52) U.S. Cl.
CPC ...................................... *G05F 5/00* (2013.01)
(58) Field of Classification Search
CPC ................... H01L 21/76254; H01L 2924/00; H01L 2924/0002
See application file for complete search history.

(56) References Cited

U.S. PATENT DOCUMENTS 6,246,598 B1 6/2001 Tarter et al.
6,956,427 B2 10/2005 Kawasaki et al.
(Continued)

FOREIGN PATENT DOCUMENTS

JP 11-097995 4/1999
JP 2003-299344 10/2003
(Continued)

OTHER PUBLICATIONS

International Search Report of PCT application No. PCT/JP2014/004201 dated Oct. 14, 2014.
(Continued)

*Primary Examiner* — Sibin Chen
(74) *Attorney, Agent, or Firm* — McDermott Will & Emery LLP

(57) ABSTRACT

A gate drive circuit includes: a modulation circuit that generates a first modulated signal and a second modulated signal; an isolator including a first electromagnetic resonance coupler that isolatedly transmits the first modulated signal, and a second electromagnetic resonance coupler that isolatedly transmits the second modulated signal; a first rectifier circuit that generates a first signal by rectifying the first modulated signal; a second rectifier circuit that generates a second signal by rectifying at least a part of the second modulated signal; a third rectifier circuit that generates charging voltage by rectifying a second radio-frequency wave; a capacitor that charges a charge in accordance with the charging voltage; and an output circuit which selects whether or not to supply the charge charged in the capacitor to a gate terminal of the semiconductor switch, in accordance with at least one of the first signal and the second signal.

20 Claims, 24 Drawing Sheets

(56) References Cited

U.S. PATENT DOCUMENTS

| 8,866,516 B2* | 10/2014 | Nagai | H02M 1/08 327/109 |
|---|---|---|---|
| 2008/0272658 A1 | 11/2008 | Kojori et al. | |
| 2012/0007571 A1 | 1/2012 | Huisman | |

FOREIGN PATENT DOCUMENTS

| JP | 2004-274262 | 9/2004 |
|---|---|---|
| JP | 2012-522477 | 9/2012 |
| JP | 2013-150454 | 8/2013 |
| WO | 2013/065254 | 5/2013 |

OTHER PUBLICATIONS

S. Nagai et al. "A DC-Isolated Gate Drive IC with Drive-by-Microwave Technology for Power Switching Devices" 2012 IEEE ISSCC Digest of Technical Papers, vol. 65, pp. 404-405, Feb. 2012.
The Extended European Search Report dated Jul. 21, 2016 for the related European Patent Application No. 14839467.9.

* cited by examiner

GATE DRIVE CIRCUIT

BACKGROUND

1. Technical Field

The present disclosure relates to a gate drive circuit to drive a semiconductor switch.

2. Description of the Related Art

As of recent, increased interest in the environment has led to demand for electric power conservation in all sorts of electric devices. Inverter systems, which switch electric power, are being viewed as being a major point in producing electric devices with reduced electric power consumption. Inverters are in use in a wide range of electric devices, such as everyday electric devices such as air conditioners, washing machines, and refrigerators, industrial-use electric devices such as power conditioners installed in solar cells, and electric device onboard electric automobiles and the like.

Such inverters are configured including a semiconductor switch for switching electric power, and a gate drive circuit for driving the semiconductor switch. A semiconductor switch, which is a power device, typically operates under high voltage of several tens of volts to several thousand volts.

On the other hand, a control signal for turning a semiconductor switch on/off is supplied from a control circuit (control integrated circuit (IC)) which operates at several volts or less. Accordingly, in such a case the gate drive circuit supplies a drive signal to the semiconductor switch while ensuring electrical isolation between an output side where the semiconductor switch is provided and an input side where the control circuit is provided. A gate drive circuit using an electromagnetic resonance coupler has been proposed of such a gate drive circuit (e.g., see S. Nagai et al., "A DC-Isolated Gate Drive IC with Drive-by-Microwave Technology for Power Switching Devices", 2012 IEEE ISSCC Digest of Technical Papers, Vol. 65, pp. 404-405, Feb. 2012, hereinafter referred to as "Nagai").

There is demand for a gate drive circuit which instantaneously supplies a great current to the gate terminal of a semiconductor switch, to turn the semiconductor switch on at a high speed.

SUMMARY

One non-limiting and exemplary embodiment provides a gate drive circuit which can supply a great current to a semiconductor switch.

A gate drive circuit according to one aspect of the present disclosure includes: a modulation circuit that generates a first modulated signal by modulating a first radio-frequency wave in accordance with a first input signal, and a second modulated signal by modulating the first radio-frequency wave in accordance with a second input signal different from the first input signal; an isolator that includes a plurality of electromagnetic resonance couplers, the plurality of electromagnetic resonance couplers including a first electromagnetic resonance coupler that isolatedly transmits the first modulated signal and a second electromagnetic resonance coupler that isolatedly transmits the second modulated signal; a first rectifier circuit that generates a first signal by rectifying the first modulated signal transmitted from the first electromagnetic resonance coupler; a second rectifier circuit that generates a second signal by rectifying at least a part of the second modulated signal transmitted from the second electromagnetic resonance coupler; a third rectifier circuit that generates charging voltage by rectifying a second radio-frequency wave isolatedly transmitted by one of the plurality of electromagnetic resonance couplers; a capacitor that charges a charge in accordance with the charging voltage; and an output circuit which selects whether or not to supply the charge charged in the capacitor to a gate terminal of a semiconductor switch, in accordance with at least one of the first signal and the second signal.

The gate drive circuit according to the present disclosure can supply a great current to a semiconductor switch.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1:
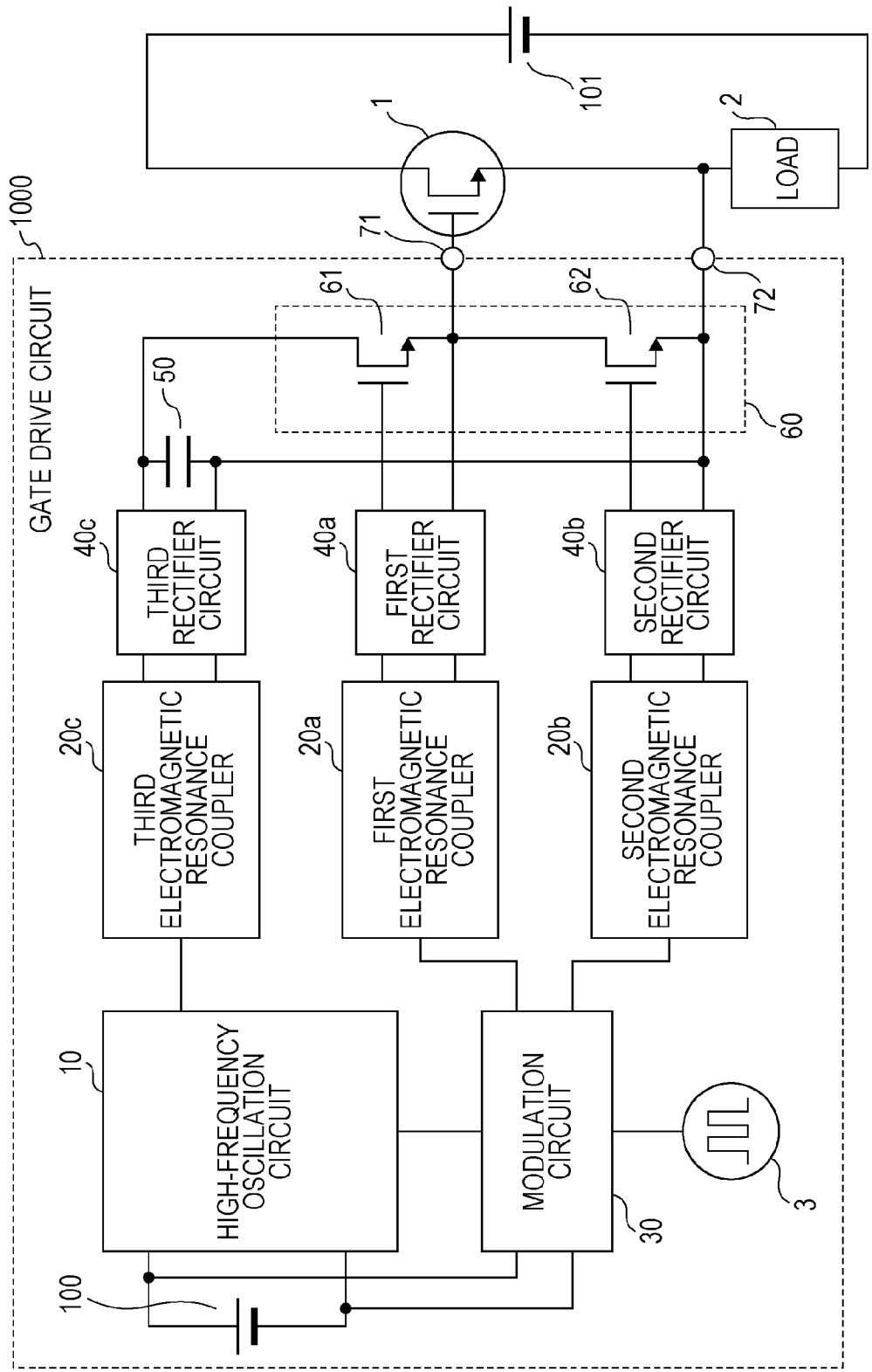
FIG. 1 is a system block diagram illustrating an example of a gate drive circuit according to a first embodiment.

Underlying Knowledge Forming Basis of the Present Disclosure

A gate drive circuit where the input side and output side are isolated, is typically used for switching semiconductor switches. A high-voltage circuit connected to the output side and a low-voltage circuit connected to the input side are isolated in a gate drive circuit. This enables malfunctioning and failure of the low-voltage circuit to be prevented by the gate drive circuit. In a gate drive circuit, the ground loop of the high-voltage circuit and the ground loop of the low-voltage circuit are isolated, so in a case where a malfunction or the like occurs at one circuit, excessive voltage can be prevented from being applied to the other circuit.

One known example of a gate drive circuit has a photocoupler. This gate drive circuit performs isolated transmission of a control signal using a photocoupler. On the other hand, the driving power supplied from a voltage source is transmitted using electromagnetic induction of a transformer. The gate drive circuit generates a drive signal by compositing a control signal and a drive power, and supplies the drive signal to the semiconductor switch.

However, gate drive circuits using a photocoupler have a great number of parts, resulting in a large footprint on the board, as well as being costly. In comparison with this, Nagai proposes a gate drive circuit which uses a microwave. This gate drive circuit supplies the drive signal and the drive power to the semiconductor switch using the microwave. More specifically, the gate drive circuit modulates the microwave, which is drive power, according to the control signal, and performs isolated transmission of the modulated microwave using an isolation device called an electromagnetic resonance coupler. Thereafter, the gate drive circuit generates the drive signal by rectifying the modulated microwave.

This sort of gate drive circuit which uses the microwave has the electromagnetic resonance coupler, which is a small single element, instead of the photocoupler and transformer which are multiple parts. Accordingly, a gate drive circuit using the microwave can be micro-miniaturized.

Now, in order to turn the semiconductor switch on at high speed, the gate drive circuit desirably can charge a sufficient charge for the gate capacitance (Ciss) of the semiconductor switch in a short time. Particularly, semiconductor switches of power devices which handle great voltage and great current have a large gate width (Wg), so gate capacitance is also great.

Even further increased speeds are being demanded of semiconductor switch operation. In order for a gate device circuit to operate a semiconductor switch of a power device at a speed equal to or faster than a semiconductor switch with a small gate width, there is a need to instantaneously apply a large current to the gate of the semiconductor switch. Accordingly, there is demand for increased current for the output of the gate drive circuit.

However, the gate drive circuit using the microwave supplies drive power to the gate terminal of the semiconductor switch using the microwave, so supplying a large drive power to the gate terminal of the semiconductor switch is difficult as compared to a conventional gate drive circuit using the photocoupler and transformer. That is to say, the gate drive circuit using the microwave has had a problem in that supplying large current to the gate terminal of the semiconductor switch is difficult.

There is known a method to solve this problem, in which a buffer circuit is added to the output portion of the gate drive circuit, so as to increase the output current output for the gate drive circuit. This method can supply a large current to the gate terminal of the semiconductor switch by switching current from the power source using a switch circuit of a configuration of transistors.

Japanese Unexamined Patent Application Publication (Translation of PCT application) No. 2012-522477 discloses a circuit having a bridge circuit serving as a switch circuit, and also having a capacitor serving as a power source. Specifically, the circuit described therein supplies electric power to the load by switching the charge state of the capacitor by switching using a floating bridge circuit.

However, in each of the above-described cases, there is a problem in that the configuration for isolating the power source (e.g., capacitor) results in a large circuit scale. Accordingly, the present inventors studied a gate drive circuit with a small circuit scale and which can supply a large current to a semiconductor switch, and reached the present disclosure.

Overview of the Embodiments

A gate drive circuit according to one aspect of the present disclosure is a gate drive circuit to drive a semiconductor switch. The gate drive circuit includes: a modulation circuit that generates a first modulated signal by modulating a first radio-frequency wave in accordance with a first input signal, and a second modulated signal by modulating the first radio-frequency wave in accordance with a second input signal different from the first input signal; an isolator configured of a plurality of electromagnetic resonance couplers, including a first electromagnetic resonance coupler that isolatedly transmits the first modulated signal, and a second electromagnetic resonance coupler that isolatedly transmits the second modulated signal; a first rectifier circuit that generates a first signal by rectifying the first modulated signal isolatedly transmitted from the first electromagnetic resonance coupler; a second rectifier circuit that generates a second signal by rectifying the second modulated signal isolatedly transmitted from the second electromagnetic resonance coupler; a third rectifier circuit that generates charging voltage by rectifying a second radio-frequency wave isolatedly transmitted by one of the plurality of electromagnetic resonance couplers; a capacitor charged in accordance with the charging voltage; and an output circuit which selects whether or not to supply a charge charged in the capacitor to a gate terminal of the semiconductor switch, in accordance with at least one of the first signal and the second signal.

Accordingly, the gate drive circuit can supply a large current to the semiconductor switch. The charging voltage is obtained by rectifying the second radio-frequency wave, so the capacitor can be charged without separately providing an isolated power source for charging the capacitor.

The isolator may further include a third electromagnetic resonance coupler that isolatedly transmits the second radio-frequency wave, for example.

Accordingly, the electromagnetic resonance couplers to isolatedly transmit modulated signals, and the electromagnetic resonance coupler to transmit the second radio-frequency wave can be separated. Accordingly, after transmission by the third electromagnetic resonance coupler, the second radio-frequency wave can be input to the third rectifier circuit without being split. Thus, a large current can be supplied to the gate terminal of the semiconductor switch.

A maximum value of amplitude of the second radio-frequency wave may be larger than a maximum value of amplitude of the first modulated signal and the second modulated signal. Accordingly, the electric power of the second radio-frequency wave to charge the capacitor can be make larger.

The gate drive circuit may further include a radio-frequency wave generator that generates the first radio-frequency wave and the second radio-frequency wave, for example.

The radio-frequency wave generator may, for example, include a frequency distribution filter which splits the radio-frequency wave into a fundamental component and a harmonic component, outputs the fundamental component as the second radio-frequency wave, and outputs the harmonic component as the first radio-frequency wave.

Accordingly, the radio-frequency wave component can be used for switching control of the output circuit. Consequently, electric power efficiency for charging the capacitor can be improved. Thus, the amount of power used for charging the capacitor can be increased, and the switching speed of the semiconductor switch can be further increased.

The radio-frequency wave generator may include an amplifier circuit that changes the amplitude of the second radio-frequency wave, for example. Accordingly, the amount of power used for charging the capacitor can be further increased, and the switching speed of the semiconductor switch can be markedly increased.

The amplifier circuit may change the amplitude of the second radio-frequency wave in accordance with a signal input to a control terminal, for example, and the third rectifier circuit may output the charging voltage when the output circuit does not supply the charge to the gate terminal of the semiconductor switch, and not output the charging voltage when the output circuit supplies the charge to the gate terminal of the semiconductor switch.

Accordingly, radio-frequency wave can be output from the radio-frequency oscillation circuit only during the period of charging the capacitor, for example, and power of the gate drive circuit can be conserved.

The second modulated signal may include the second radio-frequency wave, for example, and the third rectifier circuit may generate the charging voltage by rectifying the second modulated signal isolatedly transmitted from the second electromagnetic resonance coupler.

Accordingly, the second radio-frequency wave serving as the base for the charging voltage is isolatedly transmitted by the second electromagnetic resonance coupler which isolatedly transmits the second modulated signal, so the gate drive circuit can be simplified.

A maximum value of amplitude of the second modulated signal may be larger than a maximum value of amplitude of the first modulated signal. Accordingly, the electric power of the second radio-frequency wave for charging the capacitor can be made larger.

The gate drive circuit may further include an amplifier circuit that is disposed between the modulation circuit and the second electromagnetic resonance coupler, and that amplifies the second modulated signal. Accordingly, the electric power used for charging the capacitor can be further increased, and the switching speed of the semiconductor switch can be further increased.

The gate drive circuit may further include a radio-frequency oscillation circuit that generates the first radio-frequency wave, for example.

The third rectifier circuit may output the charging voltage when the output circuit does not supply the charge to the gate terminal of the semiconductor switch, and not output the charging voltage when the output circuit supplies the charge to the gate terminal of the semiconductor switch, for example.

Accordingly, radio-frequency wave can be output from the radio-frequency oscillation circuit only during the period of charging the capacitor, for example, thereby enabling power of the gate drive circuit to be conserved.

The output circuit may include a first switch that supplies a charge, charged in the capacitor, to the gate terminal of the semiconductor switch in accordance with the first signal, and a second switch that extracts a charge from the gate terminal of the semiconductor switch in accordance with the second signal. Forming the output circuit as a so-called half-bridge circuit configuration in this way enables the gate drive circuit to supply a large current to the semiconductor switch.

The output circuit may include a first switch and a fourth switch that supply a charge, charged in the capacitor, to the gate terminal of the semiconductor switch in accordance with the first signal, and a second switch and a third switch that extract a charge from the gate terminal, and charge the charge to the capacitor, in accordance with the second signal. Forming the driving circuit as a so-called H bridge circuit configuration in this way enables the gate drive circuit to recover charge once supplied to the semiconductor switch and charge this to the capacitor again.

The modulation circuit may be a mixer circuit that generates the first modulated signal by mixing the first input signal and the first radio-frequency wave, and generates the second modulated signal by mixing the second input signal and the first radio-frequency wave.

The second input signal may be an inverted signal of the first input signal.

The modulation circuit may be, for example, a switch circuit that generates the first modulated signal and the second modulated signal, by switching between whether to output the first radio-frequency wave to the first electromagnetic resonance coupler or to the second electromagnetic resonance coupler, in accordance with the first input signal and the second input signal.

A gate drive circuit according to another aspect of the present disclosure is an isolated gate drive circuit to drive a semiconductor switch. The gate drive circuit includes, for example: a modulation circuit that generates a modulated signal by modulating a first radio-frequency wave in accordance with an input signal; an isolator configured that includes an electromagnetic resonance coupler that isolatedly transmits the modulated signal; a rectifier circuit that generates a signal by rectifying the modulated signal isolatedly transmitted from the electromagnetic resonance coupler; another rectifier circuit that generates charging voltage by rectifying a second radio-frequency wave isolatedly transmitted by the isolator; a capacitor charged in accordance with the charging voltage; and an output circuit which selects whether or not to supply a charge charged in the capacitor to a gate terminal of the semiconductor switch, in accordance with the signal.

Accordingly, the gate drive circuit can supply a large current to the semiconductor switch. Also, charging voltage is obtained by rectifying the second radio-frequency wave, so the capacitor can be charged without separately providing an isolated power source for charging the capacitor.

The modulated signal may include the second radio-frequency wave, and the other rectifier circuit may generate the charging voltage by rectifying the second radio-frequency wave isolatedly transmitted from the electromagnetic resonance coupler, for example.

The isolator may further include a separate electromagnetic resonance coupler that isolatedly transmits the second radio-frequency wave.

Embodiments will be described in detail with reference to the drawings. Note that the drawings are schematic drawings, and are not necessarily exact illustrations. Configurations in the drawings which are substantially the same are denoted with the same reference numerals, and redundant description may be omitted or simplified.

Note that the descriptions made in the embodiments described below are all comprehensive or specific examples of the present disclosure. Values, shapes, waveforms, materials, components, placements of components and forms of connection, and so forth, in the embodiments below, are only exemplary, and do not restrict the present disclosure. Components in the following embodiments which are not included in an independent Claim indicating the highest concept are described as being optional components.

First Embodiment

Figure 2:
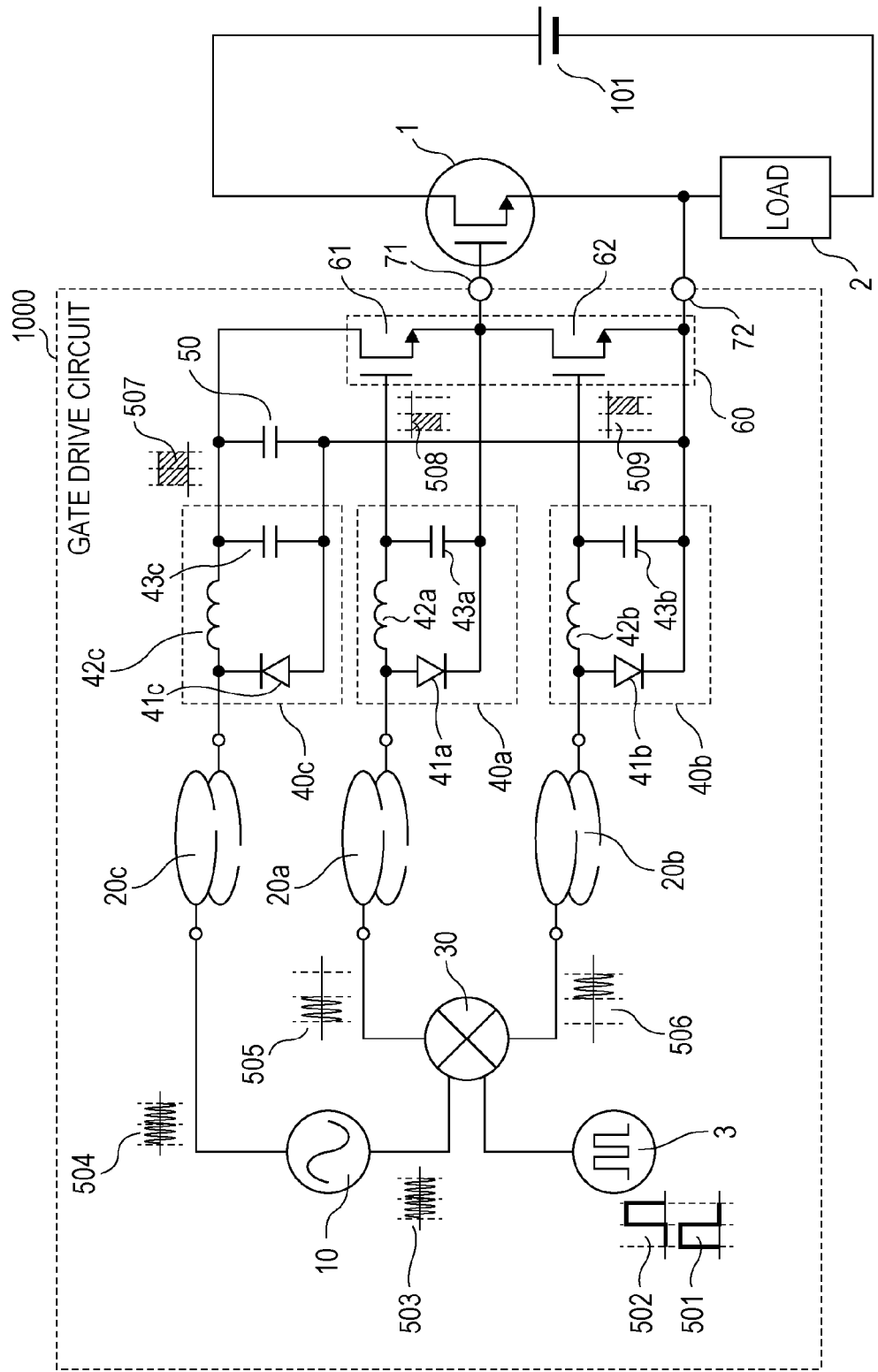
FIG. 2 is a circuit diagram illustrating a specific configuration example of the gate drive circuit according to the first embodiment.

A first embodiment will be described below with reference to the drawings. FIG. 1 is a system block illustrating an example of a gate drive circuit according to the first embodiment. FIG. 2 is a circuit diagram illustrating a specific configuration example of the gate drive circuit illustrated in FIG. 1.

A gate drive circuit 1000 includes a DC power source 100 and a signal generator 3. The gate drive circuit 1000 also includes a radio-frequency oscillation circuit 10, a modulation circuit 30, a first electromagnetic resonance coupler 20a, a second electromagnetic resonance coupler 20b, and a third electromagnetic resonance coupler 20c. The gate drive circuit 1000 also includes a first rectifier circuit 40a, a second rectifier circuit 40b, a third rectifier circuit 40c, a capacitor 50, a half bridge circuit 60, an output terminal 71, and an output reference terminal 72.

Note that the capacitor 50 is a capacitive device for example, and is not parasitic capacitance. The capacitor 50 is an element having capacitance of 10 pF or larger, for example.

The half bridge circuit 60 is configured including a first switch 61 and a second switch 62, for example, in the first embodiment. A transistor 61 is described here as a specific example of the first switch 61, and the terms may be used interchangeably while denoted by the same reference numeral. The same holds true for the second switch 62 and transistor 62. The half bridge circuit 60 is an example of an output circuit 60, and these terms may also be used interchangeably with the same reference numeral. An example will be described before where the output circuit 60 is the half bridge circuit 60 configured including the transistor 61 and the transistor 62.

The gate drive circuit 1000 is an isolated gate drive circuit for driving a semiconductor switch 1. The semiconductor switch 1 according to the present disclosure has a terminal to control current flowing at the semiconductor switch, such as a gate terminal for example. The semiconductor switch 1 is a semiconductor switch having, for example, a gate terminal, a first terminal, and a second terminal. In this case, the conductive state between the first terminal and the second terminal is controlled in accordance with a signal input to the gate terminal. One of the first terminal and second terminal may be a source terminal, and the other may be a drain terminal. One of the first terminal and second terminal may be an emitter terminal, and the other may be a collector terminal. The semiconductor switch 1 is a type of power device, for example, handling voltage of 100 V or more and current of 1 A or more.

The semiconductor switch 1 includes a gate terminal, source terminal, and a drain terminal, for example. The gate terminal of the semiconductor switch 1 is connected to the output terminal 71 of the gate drive circuit 1000, and the source terminal of the semiconductor switch 1 is connected to the output reference terminal 72 of the gate drive circuit 1000, for example. The semiconductor switch 1 may be an insulated gate bipolar transistor (IGBT), a silicon carbide (SiC) field effect transistor (FET), or a gallium nitride (GaN) transistor. In the example illustrated in FIG. 1, a load 2 is connected serially with the semiconductor switch 1. Specifically, one end of the load 2 is connected to the source terminal of the semiconductor switch 1. The positive terminal of a DC power source 101 is connected to the drain terminal of the semiconductor switch 1, and the negative terminal of the DC power source 101 is connected to the other end of the load 2.

The DC power source 100 is a power source which supplies power so that the radio-frequency oscillation circuit 10 and modulation circuit 30 can operate, for example. While FIG. 1 illustrates the DC power source 100 as being provided within the gate drive circuit 1000, this may be provided externally from the gate drive circuit 1000. That is to say, the gate drive circuit 1000 does not have to have the DC power source 100.

The signal generator 3 generates an input signal, and outputs it to the modulation circuit 30. The input signal is equivalent to the control signal, and a driving signal to drive the semiconductor switch 1 is generated based on the control signal. The signal generator 3 includes a logic IC, for example. The input signal is a binary signal of high level and low level, as can be seen from waveform 501 and waveform 502 in FIG. 2.

The input signal may include a first input signal and second input signal. In the example illustrated in FIG. 2, the waveform 501 is the first input signal, and the waveform 502 is the second input signal. The first input signal includes a first low-level voltage, and a first high-level voltage larger than the first low-level voltage, for example. The second input signal includes a second low-level voltage, and a second high-level voltage larger than the second low-level voltage, for example. The second input signal may exhibit second low-level voltage during a period in which the first input signal exhibits first high-level voltage. The first input signal may exhibit first low-level voltage during a period in which the second input signal exhibits second high-level voltage. The second input signal may be a signal obtained by inverting the first input signal. For example, the second input signal may be a signal obtained by inverting the first input signal at an intermediate value between the first high-level voltage and the second high-level voltage as a reference. In this case, the first input signal and the second input signal may be in a complementary relation, as illustrated in FIG. 2. The first low-level voltage and/or second low-level voltage may be 0 V, for example.

While the signal generator 3 is provided within the gate drive circuit 1000 in FIGS. 1 and 2, this may be provided externally from the gate drive circuit 1000. In this case, the gate drive circuit 1000 has a first input terminal to which an input signal is input. That is to say, the gate drive circuit 1000 does not have to have the signal generator 3.

The radio-frequency oscillation circuit 10 generates a radio-frequency wave. The radio-frequency wave may be a microwave. The radio-frequency wave serves to transmit electric power. The radio-frequency oscillation circuit 10 has at least two output systems. The radio-frequency oscillation circuit 10 outputs the generated radio-frequency wave to the modulation circuit 30 and the third electromagnetic resonance coupler 20c. The radio-frequency wave has waveform such as those of the waveform 503 and waveform 504 illustrated in FIG. 2. The frequency of the radio-frequency wave may be 2.4 GHz or 5.8 GHz which is ISM bands available for unlicensed use if output is low, or may be other frequency. The radio-frequency oscillation circuit 10 specifically may be a Colpitts oscillator, a Hartley oscillator, or some other oscillator which generates the microwave. The radio-frequency oscillation circuit 10 may include a frequency adjusting mechanism for cases where the frequency of radio-frequency wave fluctuates. Note that the radio-frequency wave generated by the radio-frequency oscillation circuit 10 has a certain amplitude and a certain frequency, for example.

In the present disclosure, a radio-frequency wave to be modulated by the first input signal and/or the second input signal, that is to say a radio-frequency wave which is a carrier wave for the first input signal and/or the second input signal, may be referred to as a first radio-frequency wave, and a radio-frequency wave for supplying electric power for charging may be referred to as a second radio-frequency wave. In the example illustrated in FIG. 2, the waveform 503 represents the first radio-frequency wave and the waveform 504 represents the second radio-frequency wave. Note that the second radio-frequency wave is input to the third electromagnetic resonance coupler in the first embodiment. In this case, the second radio-frequency wave may have a certain amplitude, or may have multiple amplitudes. That is to say, the second radio-frequency wave may have signal components based on multiple different amplitudes. The first radio-frequency wave and the second radio-frequency wave may have the same amplitude, or may have different amplitudes. It should be noted, however, in a case where the second radio-frequency wave has a greater amplitude than the first radio-frequency wave, the amount of charge which is charged to the capacitor can be increased, which will be described later. The first radio-frequency wave and the second radio-frequency wave may have the same frequency, or may have different frequencies.

Note that in FIGS. 1 and 2, the radio-frequency oscillation circuit 10 is provided within the gate drive circuit 1000, but may be provided externally from the gate drive circuit 1000. In this case, the gate drive circuit 1000 has a second input terminal to which the radio-frequency wave is input. That is to say, the gate drive circuit 1000 may have the radio-frequency oscillation circuit 10. The radio-frequency oscillation circuit 10 may be included in a radio-frequency wave generator, as described later.

The modulation circuit 30 generates a first modulated signal by modulating the radio-frequency wave in accordance with the first input signal output from the signal generator 3, and outputs the first modulated signal to the first electromagnetic resonance coupler 20a. In a case where the modulation circuit 30 is a frequency mixer such as illustrated in FIG. 2, the modulation circuit 30 mixes the first input signal and the radio-frequency wave to generate the first modulated signal. The first modulated signal has a waveform such as represented by waveform 505 in FIG. 2, for example.

Further, the modulation circuit 30 generates a second modulated signal by modulating the radio-frequency wave in accordance with the second input signal output from the signal generator 3 which are different from the first input signal, and outputs the second modulated signal to the second electromagnetic resonance coupler 20b. Specifically, in a case where the modulation circuit 30 is a frequency mixer such as illustrated in FIG. 2, the modulation circuit 30 mixes the second input signal and the radio-frequency wave to generate the second modulated signal. The second modulated signal has a waveform such as represented by waveform 506 in FIG. 2, for example. In a case where the second input signal are a signal obtained by inverting the first input signal, the first modulated signal and the second modulated signal are in a complementary relationship.

The first modulated signal includes a first amplitude, and a second amplitude which is larger than the first amplitude, for example. The first amplitude of the first modulated signal corresponds to the first low-level voltage of the first input signal for example, and the second amplitude of the first modulated signal corresponds to the first high-level voltage of the first input signal, for example. The second modulated signal includes a third amplitude, and a fourth amplitude which is larger than the third amplitude, for example. The third amplitude of the second modulated signal corresponds to the second low-level voltage of the second input signal for example, and the fourth amplitude of the second modulated signal corresponds to the second high-level voltage of the second input signal, for example. The second modulated signal may exhibit the third amplitude in a period where the first modulated signal exhibits the second amplitude. The first modulated signal may exhibit the first amplitude in a period where the second modulated signal exhibits the fourth amplitude. The first amplitude and third amplitude, and/or the second amplitude and fourth amplitude, may be the same value. The first amplitude and/or the third amplitude may be zero. While the first modulated signal and the second modulated signal have been described as being in a complementary relationship in the example illustrated in FIG. 2, the input signal may be other waveform which is more optimal.

In the example illustrated in FIG. 2, the modulation circuit 30 is a frequency mixer, and more specifically is a so-called differential mixer. A differential mixer is capable of modulating the radio-frequency wave with low loss, and also can have multiple input/output terminals.

Figure 3:
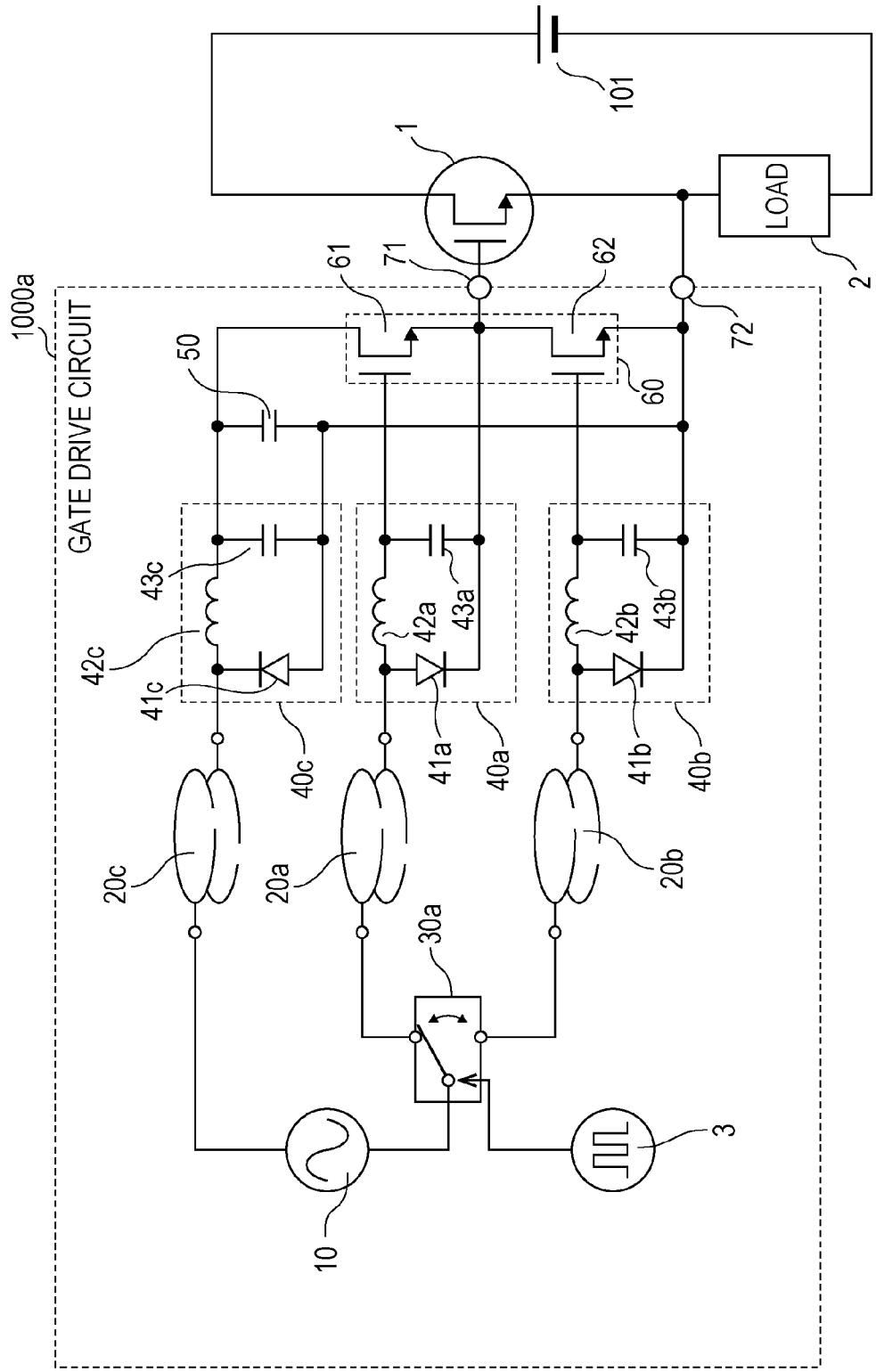
FIG. 3 is a circuit diagram illustrating a specific configuration example of the gate drive circuit according to the first embodiment.
Figure 4:
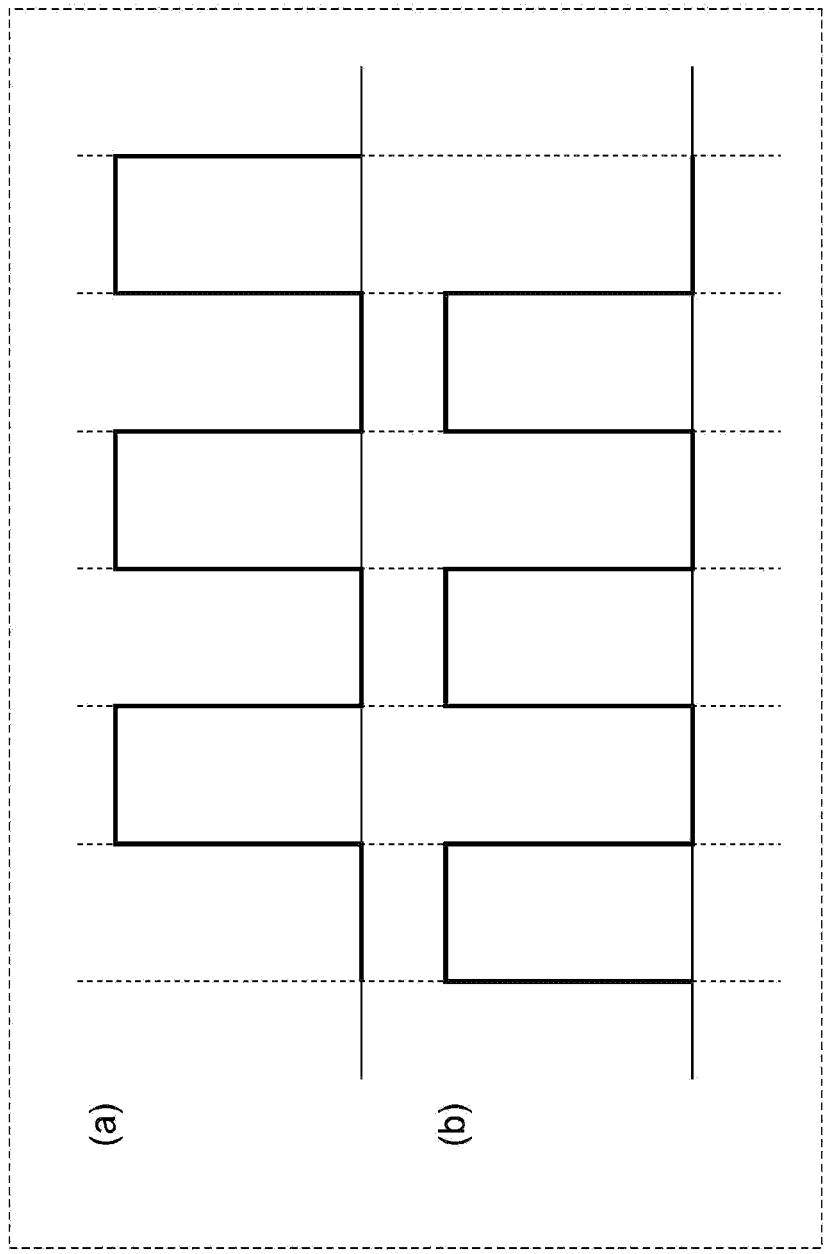
FIG. 4 is a diagram illustrating an example of an input signal in the gate drive circuit according to the first embodiment.

Alternatively, the modulation circuit 30 may be a switch circuit. FIG. 3 is a circuit diagram illustrating a specific configuration example of a gate drive circuit having a switch circuit as the modulation circuit. In a gate drive circuit 1000a illustrated in FIG. 3, a switch circuit 30a (also "modulation circuit 30a") switches between outputting the radio-frequency wave to the first electromagnetic resonance coupler 20a and outputting to the second electromagnetic resonance coupler 20b, in accordance with input signal, thereby generating the first modulated signal and the second modulated signal. Note that in this case, the input signal is one of complementary signals such as illustrated in parts (a) and (b) of FIG. 4. Such a signal is generated by the signal generator 3 including a logic IC, for example, which includes a silicon (Si) complementary metal-oxide semiconductor or compound semiconductor. The input signal may also be a pulse width modulation (PWM) signal or the like, where the duty is not constant, for example. In the example illustrated in FIG. 4, the signal illustrated in part of (a) in part (a) of FIG. 4 may be the first input signal, and the signal illustrated in part (b) of FIG. 4 may be the second input signal, for example.

In a case where a switch circuit is used as the modulation circuit 30a, the isolation between the output terminals of the modulation circuit 30a improves. The modulation circuit 30a also does not need a matching circuit such as an inductor or the like, so the size of the gate drive circuit 1000 can be reduced.

The first electromagnetic resonance coupler 20a performs isolated transmission of the first modulated signal generated by the modulation circuit 30. The second electromagnetic resonance coupler 20b, performs isolated transmission of the second modulated signal generated by the modulation circuit 30. The third electromagnetic resonance coupler 20c performs isolated transmission of the radio-frequency wave generated by the radio-frequency oscillation circuit 10.

A group which includes at least one of the first electromagnetic resonance coupler 20a, second electromagnetic resonance coupler 20b, and third electromagnetic resonance coupler 20c, may be referred to as an isolator in the present disclosure. Note that "isolator" is a collective term of one or more electromagnetic resonance couplers, and does not restrict the layout or structure of the individual electromagnetic resonance couplers. For example, in a case where an isolator includes multiple electromagnetic resonance couplers, the electromagnetic resonance couplers do not have to be structurally disposed as a single unit. The isolator in the first embodiment includes the first electromagnetic resonance coupler 20a, second electromagnetic resonance coupler 20b, and third electromagnetic resonance coupler 20c.

Now, a configuration example of an electromagnetic resonance coupler 20 will be described in detail. The electromagnetic resonance coupler 20 may be used as the first electromagnetic resonance coupler 20a, second electromagnetic resonance coupler 20b, and third electromagnetic resonance coupler 20c.

Figure 5:
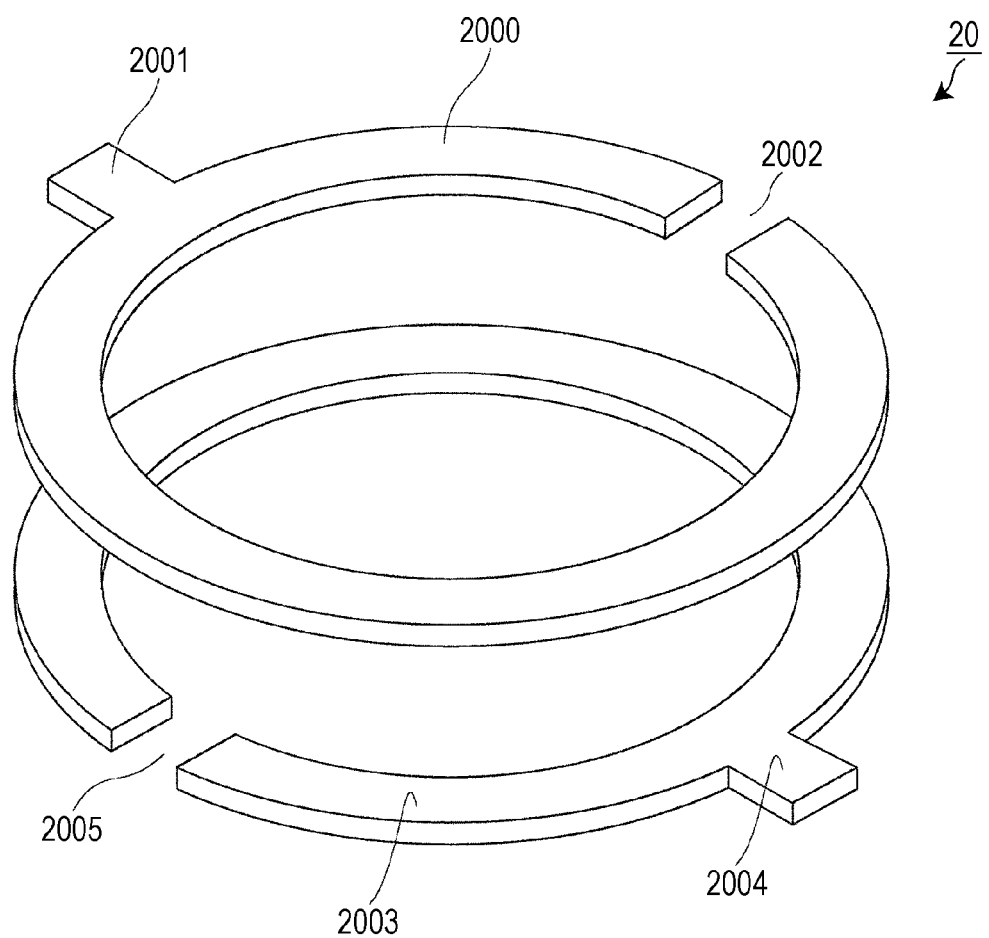
FIG. 5 is a diagram illustrating a configuration example of an electromagnetic resonance coupler in the gate drive circuit according to the first embodiment.

FIG. 5 is a diagram illustrating a configuration example of an electromagnetic resonance coupler. The electromagnetic resonance coupler 20 includes a first resonator 2000 and a second resonator 2003, as illustrated in FIG. 5. The electromagnetic resonance coupler 20 is a so-called open-ring electromagnetic resonance coupler which performs isolated transmission (i.e., contactless transmission) of a signal to be transmitted.

The first resonator 2000 is a loop-shaped transmission line formed of metal wiring, and has an open portion 2002 at an optional position on the transmission line. The second resonator 2003 is a loop-shaped transmission line formed of metal wiring, and has an open portion 2005 at an optional position on the transmission line. The metal lines used for the first resonator 2000 and the second resonator 2003 may be formed of copper, for example, or formed of gold or some other metal.

The first resonator 2000 and the second resonator 2003 are disposed facing each other with a predetermined space therebetween. In other words, the first resonator 2000 and the second resonator 2003 are radio-frequency antennas in loop shapes. The line lengths of the first resonator 2000 and the second resonator 2003 each are, for example, ½ the wavelength of the signal to be transmitted.

A first input terminal 2001 is a metal line for performing input/output of the signal to be transmitted to/from the first resonator 2000, and is situated at an optional position on the first resonator 2000. In the same way, a second input/output terminal 2004 performs input/output of the signal to be transmitted to/from the second resonator 2003, and is situated at an optional position on the second resonator 2003.

The signal to be transmitted which is input to the first input/output terminal 2001 are output to the second input/output terminal 2004 in the electromagnetic resonance coupler 20, and the signal to be transmitted which is input to the second input/output terminal 2004 are output to the first input/output terminal 2001. The metal lines used for the first input/output terminal 2001 and second input/output terminal 2004 may be formed of copper, for example, or formed of gold or some other metal.

The electromagnetic resonance coupler 20 is capable of isolated transmission with low loss, and the distance between the resonators can be great. The length of the resonators (e.g., the length of the transmission line) is dependent on the frequency of the signal to be transmitted as described above, so the higher the frequency of the signal is, the smaller the resonators are.

Note that the outline of the electromagnetic resonance coupler 20 may be rectangular, for example. Any type may be used for the electromagnetic resonance coupler 20 as long as the signal can be contactlessly transmitted using electromagnetic resonance coupling. Note that the first electromagnetic resonance coupler 20a, the second electromagnetic resonance coupler 20b, and the third electromagnetic resonance coupler 20c each do not have to be individual elements. For example, a single isolated element may include the functions of the first electromagnetic resonance coupler 20a and the second electromagnetic resonance coupler 20b. In other words, it is sufficient for a single isolated element to isolatedly transmit the first modulated signal and the second modulated signal.

The first rectifier circuit 40a generates first signal by rectifying the first modulated signal isolatedly transmitted from the first electromagnetic resonance coupler 20a. The first rectifier circuit 40a is configured including a diode 41a, inductor 42a, and capacitor 43a. The first signal has a waveform such as the waveform 508 in FIG. 2. The first signal are output from the first rectifier circuit 40a, and are input to the gate terminal of the transistor 61, for example.

The second rectifier circuit 40b generates a second signal by rectifying the second modulated signal isolatedly transmitted from the second electromagnetic resonance coupler 20b. The second rectifier circuit 40b is configured including a diode 41b, inductor 42b, and capacitor 43b. The second signal has a waveform such as the waveform 509 in FIG. 2. The second signal is output from the second rectifier circuit 40b, and is input to the gate terminal of the transistor 62, for example.

The first signal includes, for example, a first off voltage, and a first on voltage which is different from the first off voltage. In a case where the transistor 61 is an N-type transistor, the first on voltage is larger than the first off voltage. In a case where the transistor 61 is a P-type transistor, the first on voltage is smaller than the first off voltage. In a case where the transistor 61 is a normally-off transistor, the first off voltage of the first signal corresponds to the first amplitude of the first modulated signal for example, and the first on voltage of the first signal corresponds to the second amplitude of the first modulated signal. In this case, the first off voltage of the first signal corresponds to the first low-level voltage of the first input signal for example, and the first on voltage of the first signal corresponds to the first high-level voltage of the first input signal for example. In a case where the transistor 61 is a normally-on transistor, the first off voltage of the first signal corresponds to the second amplitude of the first modulated signal for example, and the first on voltage of the first signal corresponds to the first amplitude of the first modulated signal. In this case, the first off voltage of the first signal corresponds to the first high-level voltage of the first input signal for example, and the first on voltage of the first signal corresponds to the first low-level voltage of the first input signal for example.

The second signal includes, for example, a second off voltage, and a second on voltage which is different from the second off voltage. In a case where the transistor 62 is an N-type transistor, the second on voltage is larger than the second off voltage. In a case where the transistor 61 is a P-type transistor, the second on voltage is smaller than the second off voltage. In a case where the transistor 61 is a normally-off transistor, the second off voltage of the second signal corresponds to the third amplitude of the second modulated signal for example, and the second on voltage of the second signal corresponds to the fourth amplitude of the second modulated signal, for example. In this case, the second off voltage of the second signal corresponds to the second low-level voltage of the second input signal for example, and the second on voltage of the second signal corresponds to the second high-level voltage of the second input signal for example. In a case where the transistor 62 is a normally-on transistor, the second off voltage of the second signal corresponds to the fourth amplitude of the second modulated signal for example, and the second on voltage of the second signal corresponds to the third amplitude of the second modulated signal, for example. In this case, the second off voltage of the second signal corresponds to the second high-level voltage of the second input signal for example, and the second on voltage of the second signal corresponds to the second low-level voltage of the second input signal for example.

The second signal may exhibit the second off voltage in a period in which the first signal exhibits the first on voltage. The first signal may exhibit the first off voltage in a period in which the second signal exhibits the second on voltage. The first signal and second signal may be in a complementary relationship, or may be in some other relationship. The first off voltage and the second off voltage, and/or the first on voltage and the second on voltage, may be the same value.

In the following description will be made regarding a case where the transistor 61 and transistor 62 are normally-on and N-type transistors, unless specifically stated otherwise. Specifically, an example will be described where the first on voltage and second on voltage are zero, and the first off voltage and second off voltage are a negative value, as illustrated in FIG. 2.

The third rectifier circuit 40c generates a third signal by rectifying the second radio-frequency wave isolatedly transmitted from the third electromagnetic resonance coupler 20c. The third signal is a signal of a waveform such as waveform 507 in FIG. 2. The third rectifier circuit 40c charges the capacitor 50 with the generated third signal. The third signal has a DC voltage component.

As illustrated in FIG. 2, the third signal may be a constant voltage value. In other words, the third signal does not have to be configured from multiple voltage values. That is to say, the third signal does not have to include a signal component. It is sufficient for the third signal to have power to charge the capacitor. Voltage for charging the capacitor may be referred to as "charging voltage" in the present disclosure. The third signal may include the charging voltage alone, as illustrated in FIG. 2, or may include the charging voltage and also another voltage smaller than the charging voltage. The charging voltage may be larger than the first on voltage of the first signal and the first on voltage of the second signal. In this case, the charge amount charged to the capacitor is greater. The third signal may exhibit charging voltage in a period in which the second signal exhibits the second on voltage, and further, the third signal may exhibit charging voltage in a period in which the first signal exhibits the first on voltage, as illustrated in FIG. 2.

Now, a configuration example of a rectifier circuit 40 will be described in detail. The rectifier circuit 40 may be used as the first rectifier circuit 40a, the second rectifier circuit 40b, and the third rectifier circuit 40c. A specific example of the third rectifier circuit 40c will be described below as an example of the rectifier circuit 40. Note however, that the specific example described below may also be similarly applied to the first rectifier circuit 40a and the second rectifier circuit 40b. The third rectifier circuit 40c is configured including a diode 41c, inductor 42c, and capacitor 43c. The third rectifier circuit 40c has a configuration similar to that of a circuit called a rectenna (i.e., rectifying antenna). In the third rectifier circuit 40c, one end of the inductor 42c is connected to one end of the diode 41c, the other end of the inductor 42c is connected to one end of the capacitor 43c, and the other end of the diode 41c and the other end of the capacitor 43c are connected to the output reference node of the third rectifier circuit 40c. The connection point between the one end of the inductor 42c and the one end of the diode 41c functions as an input node of the third rectifier circuit 40c, and the connection point between the other end of the inductor 42c and the one end of the capacitor 43c functions as an output node of the third rectifier circuit 40c.

The cathode of the diode 41c is connected to the input node of the third rectifier circuit 40c in the example illustrated in FIG. 2. Accordingly, the third rectifier circuit 40c rectifies the positive voltage component of the second radio-frequency wave. On the other hand, the anode of the diode 41a is connected to the input node of the first rectifier circuit 40a, and the anode of the diode 41b is connected to the input node of the second rectifier circuit 40b. Accordingly, the first rectifier circuit 40a and the second rectifier circuit 40b rectify the negative voltage component of the modulated signal. Whether the voltage component which the rectifier circuits rectify is positive or negative is not restricted in particular. The polarity of these may be set as appropriate in accordance with the properties of the output circuit 60. For example, the polarity of these may be set as appropriate in accordance with whether the transistor 61 and transistor 62 included in the output circuit 60 are normally-on or normally-off, and whether N-type or P-type.

Now, the output node of the third rectifier circuit 40c is adjusted by the inductor 42c and capacitor 43c to be at the short-circuit point of the frequency of the radio-frequency wave. Accordingly, the radio-frequency wave input from the input node of the third rectifier circuit 40c is reflected near the output node of the third rectifier circuit 40c. Thus, the amplitude (i.e., voltage value) of radio-frequency wave at the input node of the third rectifier circuit 40c is approximately twice the amplitude (i.e., voltage value) of the original radio-frequency wave input from the third electromagnetic resonance coupler 20c. This configuration enables radio-frequency wave to be efficiently rectified by a single diode 41c. Note that even if the output node of the third rectifier circuit 40c is not precisely the short-circuit point of the frequency of the radio-frequency wave, highly efficient rectification can be performed as long as the third rectifier circuit 40c operates as a low-pass filter of a predetermined frequency.

The third rectifier circuit 40c has microwave band rectification properties, for example. In this case, a Schottky barrier diode, for example, is used for the diode 41c. In a case where the diode 41c is a Schottky barrier diode using GaN (gallium nitride), radio-frequency wave properties, low forward voltage, and low on-state resistance can be realized. The diode 41c may be Si or other devices as well, as a matter of course. The frequency of the radio-frequency wave was set to 2.4 GHz in a later-described simulation and measurement. The diode 41c used was a GaN Schottky barrier diode with an anode width of 100 μm. The inductance of the inductor 42c was 5 NH, and the capacitance of the capacitor 43c was 10 pF.

The half bridge circuit 60 includes the transistor 61 and the transistor 62. The transistor 61 supplies the charge charged in the capacitor 50 to the gate terminal of the semiconductor switch 1 in accordance with the first signal. The transistor 62 extracts the charge from the gate terminal of the semiconductor switch 1 in accordance with the second signal.

The transistor 61 supplies the charge charged in the capacitor 50 to the gate terminal of the semiconductor switch 1, in accordance to the first signal. The drain terminal of the transistor 61 is connected to one end of the capacitor 50, and the source terminal of the transistor 61 is connected to the output terminal 71, the drain terminal of the transistor 62, and the output reference node of the first rectifier circuit 40a. The gate terminal of the transistor 61 is connected to the output node of the first rectifier circuit 40a.

The drain terminal and source terminal of the transistor 61 conduct to each other when the first on voltage of the first signal is input to the gate terminal, and accordingly the one end of the capacitor 50 and the output terminal 71 conduct to each other. The drain terminal and source terminal of the transistor 61 are isolated when the first off voltage of the first signal is input to the gate terminal, for example, and accordingly the one end of the capacitor 50 and the output terminal 71 are isolated.

The transistor 62 extracts the charge from the gate terminal of the semiconductor switch 1 in accordance with the second signal. The drain terminal of the transistor 62 is connected to output terminal 71 and the source terminal of the transistor 61, and the source terminal of the transistor 62 is connected to the output reference terminal 72, the other end of the capacitor 50, and further to the output reference node of the second rectifier circuit 40b. The gate terminal of the transistor 62 is connected to the output node of the second rectifier circuit 40b.

The drain terminal and source terminal of the transistor 62 conduct to each other when the second on voltage of the second signal is input to the gate terminal, for example, and accordingly the output terminal 71 and output reference terminal 72 conduct to each other. The drain terminal and source terminal of the transistor 62 are isolated when the second off voltage of the second signal is input to the gate terminal, for example, and accordingly the output terminal 71 and output reference terminal 72 are isolated.

Figure 6A:
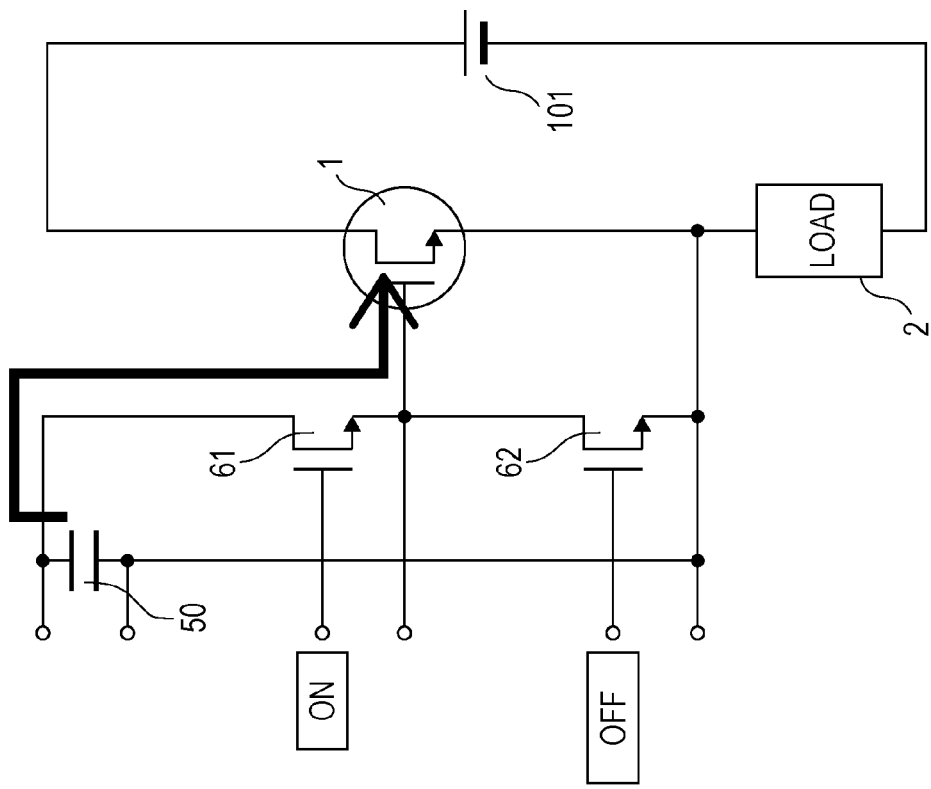
FIGS. 6A and 6B are diagrams for describing an operation example of a half bridge circuit in the gate drive circuit according to the first embodiment.
Figure 6B:
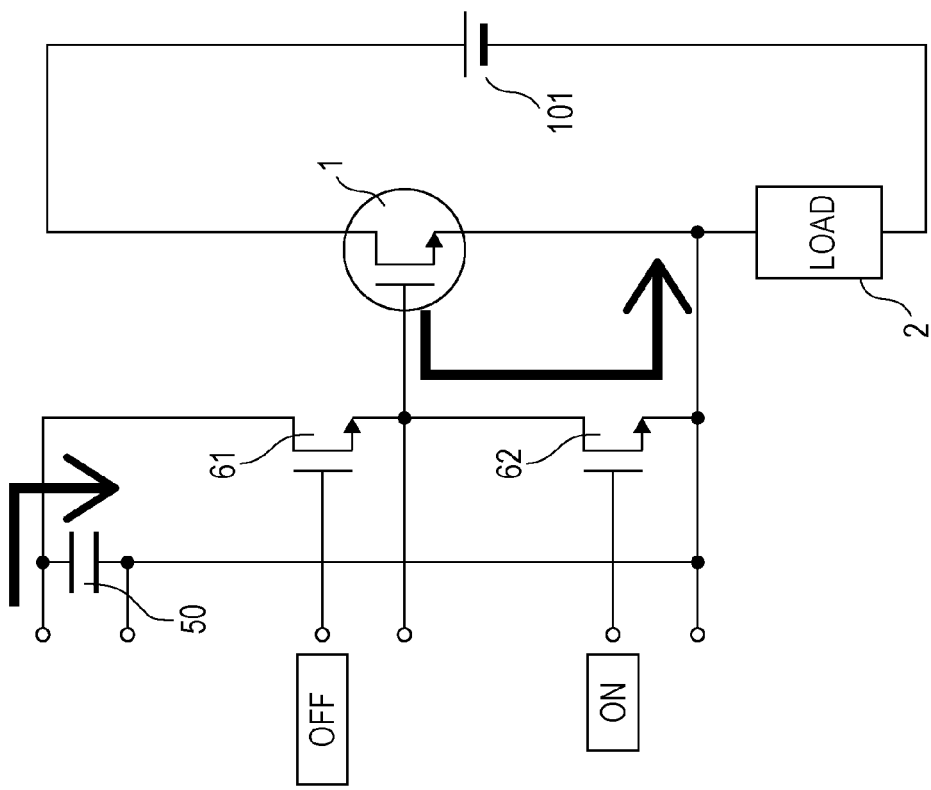
Figure 7:
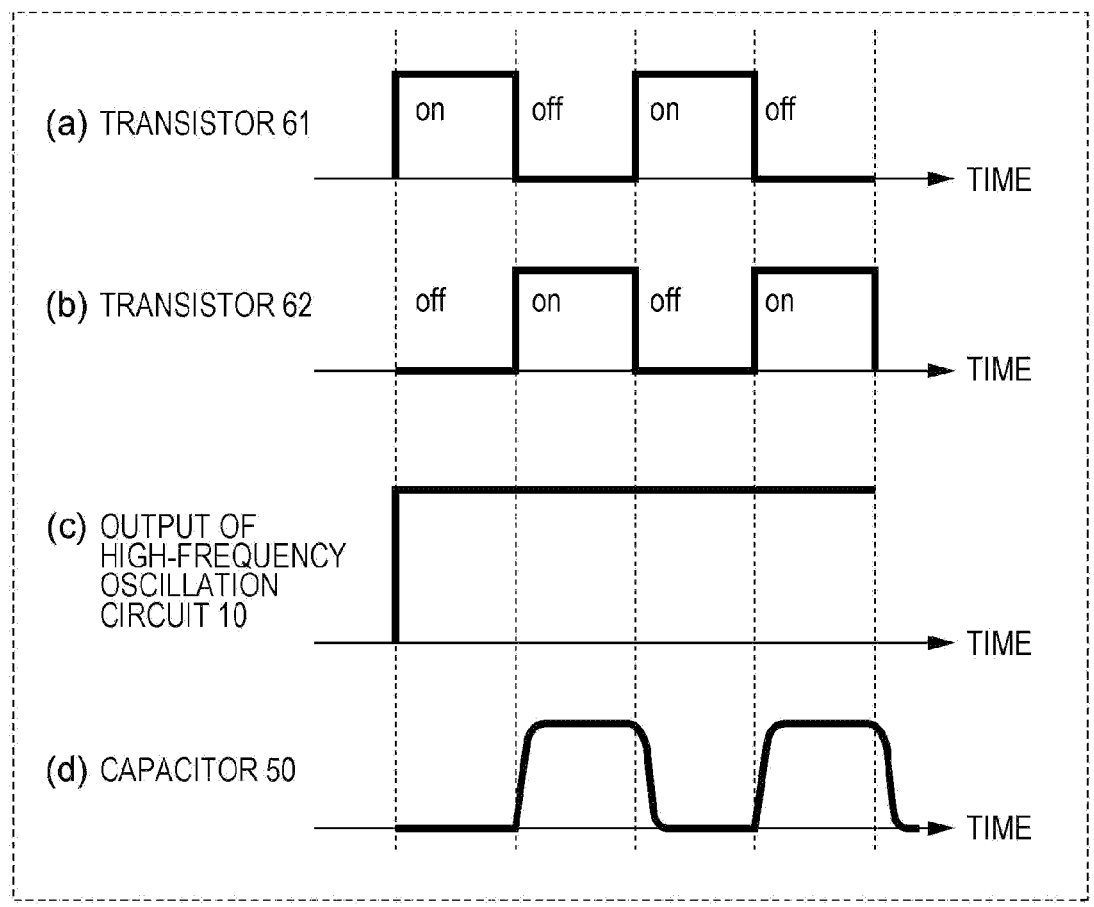
FIG. 7 is a diagram illustrating an example of the relationship between voltage across the gate/source of transistors included in the half bridge circuit, and electric charge that is charged to a capacitor, in the gate drive circuit according to the first embodiment.

The operation of the half bridge circuit 60 will be described in detail here. FIGS. 6A and 6B are diagrams for describing an operation example of the half bridge circuit 60. FIG. 7 is a diagrams illustrating the relationship between the voltage between the gate and source of the transistor 61 and transistor 62 and the charge charged in the capacitor 50. Note that the voltage between the gate and source is the voltage at the gate terminal of each transistor with the source terminal as a reference. FIG. 7 also illustrates output to the third electromagnetic resonance coupler 20c of the radio-frequency oscillation circuit 10, i.e., the amplitude of the second radio-frequency wave.

The half bridge circuit 60 alternates between a state where the transistor 61 is on and the transistor 62 is off, and a state where the transistor 61 is off and the transistor 62 is on, in accordance with the first signal and second signal, as illustrated in parts (a) and (b) of FIG. 7. Thus, the half bridge circuit 60 switches the semiconductor switch 1. That is to say, the half bridge circuit 60 supplies the charge (i.e., driving electric power) charged in the capacitor 50 to the semiconductor switch 1, in accordance with the input signal.

FIG. 6A illustrates a state where the transistor 61 is off and the transistor 62 is on. That is to say, FIG. 6A is a state where off voltage is applied between the gate and source of the transistor 61, and on voltage is applied between the gate and source of the transistor 62. In the state in FIG. 6A, the capacitor 50 is charged by a charge, but the transistor 61 is in the off state, so current is not supplied to the semiconductor switch 1.

On the other hand, FIG. 6B illustrates a state where the transistor 61 is on and the transistor 62 is off. That is to say, FIG. 6B is a state where on voltage is applied between the gate and source of the transistor 61, and off voltage is applied between the gate and source of the transistor 62. In the state in FIG. 6B, the charge which has been charged to the capacitor 50 in the state in FIG. 6A is supplied to the gate terminal of the semiconductor switch 1.

In a case where the state is switched from that in FIG. 6B to a state where the transistor 61 is off and the transistor 62 is on, the capacitor 50 is charged again as illustrated in FIG. 6A, and the charge accumulated at the gate terminal of the semiconductor switch 1 is discharged to the output reference terminal 72 by the transistor 62. The above-described operations enable the gate drive circuit 1000 to instantaneously supply a large current to the semiconductor switch 1.

Figure 8:
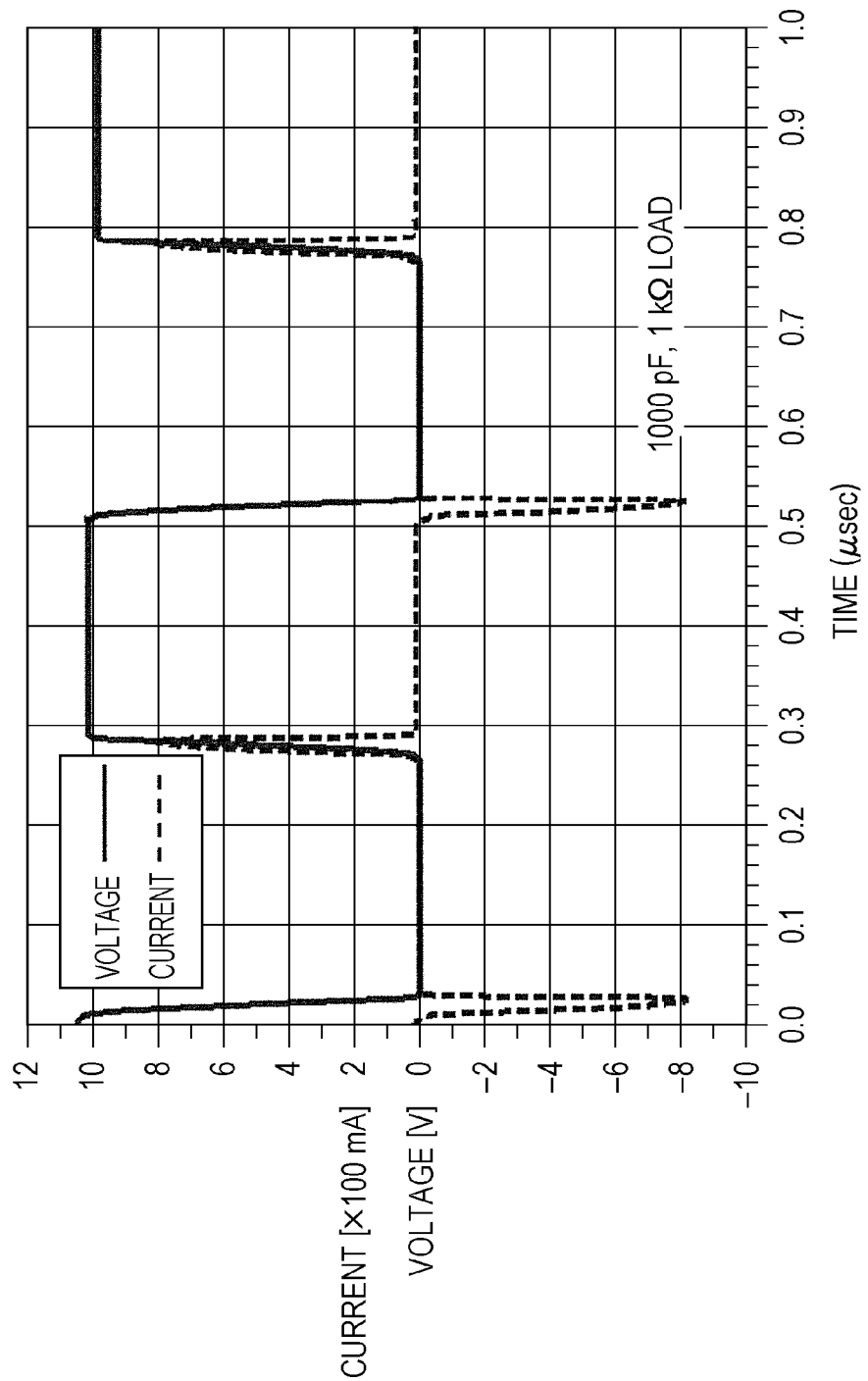
FIG. 8 is a diagram illustrating simulation results of output waveforms output from an output terminal in the gate drive circuit according to the first embodiment.

FIG. 8 is a diagram illustrating simulation results of output waveforms output from the output terminal 71, i.e., an example of waveforms of driving signals which the gate drive circuit 1000 outputs to the semiconductor switch 1. The simulation conditions were set as follows. The transistor 61 and transistor 62 were GaN hetero field effect transistors (HFET) having a gate width of 4.8 mm and a gate length of 0.7 μm. The capacitor 50 was a capacitor having capacitance of 200 nF. The input signal was a 2 MHz rectangular wave. A capacitive element having capacitance of 1000 pF and a resistive element having resistance of 1 kΩ were connected in parallel, instead of the semiconductor switch 1, for the load in the simulation.

The voltage of the output signal (i.e., the voltage input to the gate terminal of the semiconductor switch 1) in the simulation of the gate drive circuit 1000 was 0 to 10 V, as can be seen from FIG. 8. The peak value of the current supplied to the gate terminal of the semiconductor switch 1 by the output signal was 0.8 A. A conventional gate drive circuit using a microwave was only able to supply current of 0.1 A or less to the gate terminal of the semiconductor switch 1. Thus, the simulation results illustrate that the gate drive circuit 1000 is able to output eight times or more the current of a conventional arrangement.

Figure 9:
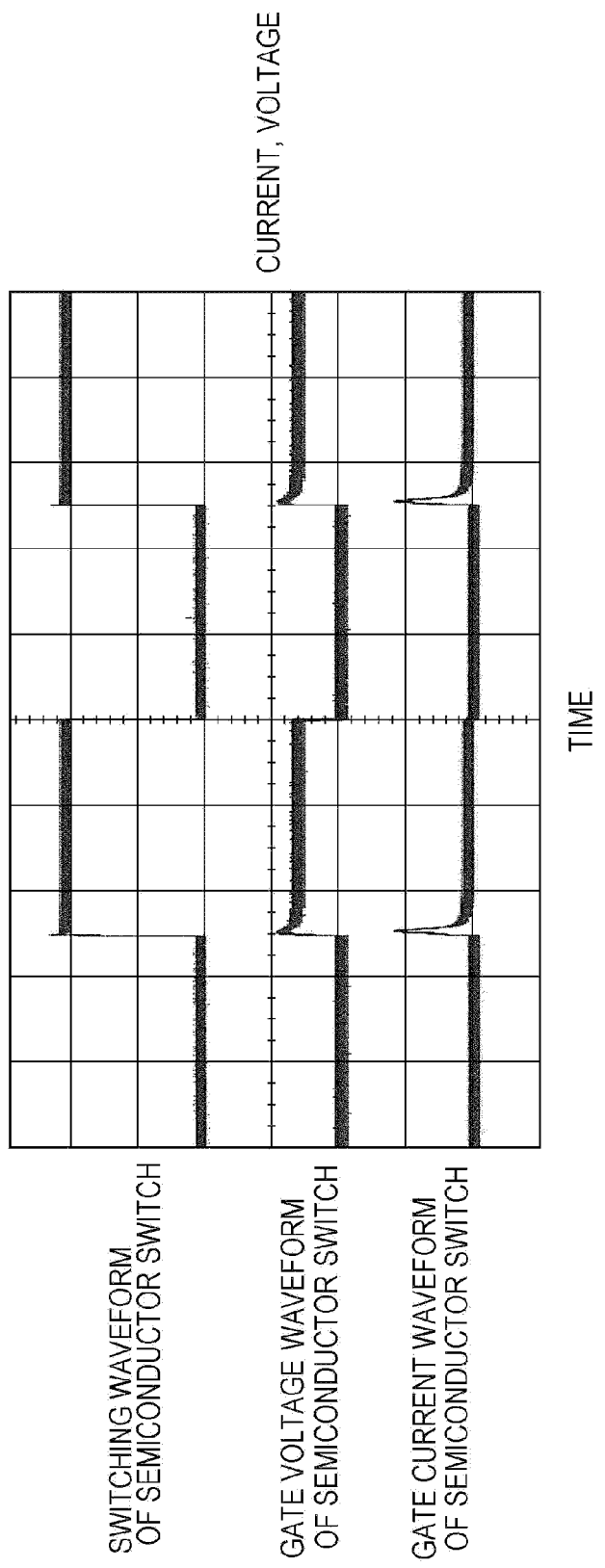
FIG. 9 is a diagram illustrating actual measurement results of output waveforms output from an output terminal in the gate drive circuit according to the first embodiment.

FIG. 9 is a diagram illustrating actual measurement results of output waveforms output from output terminal 71 with the gate drive circuit 1000 actually being driven. The semiconductor switch 1 in this actual measurement was a GaN power transistor. The actual measurement results also yielded results that the gate drive circuit 1000 is capable of outputting a large current, as illustrated in FIG. 9.

Figure 10:
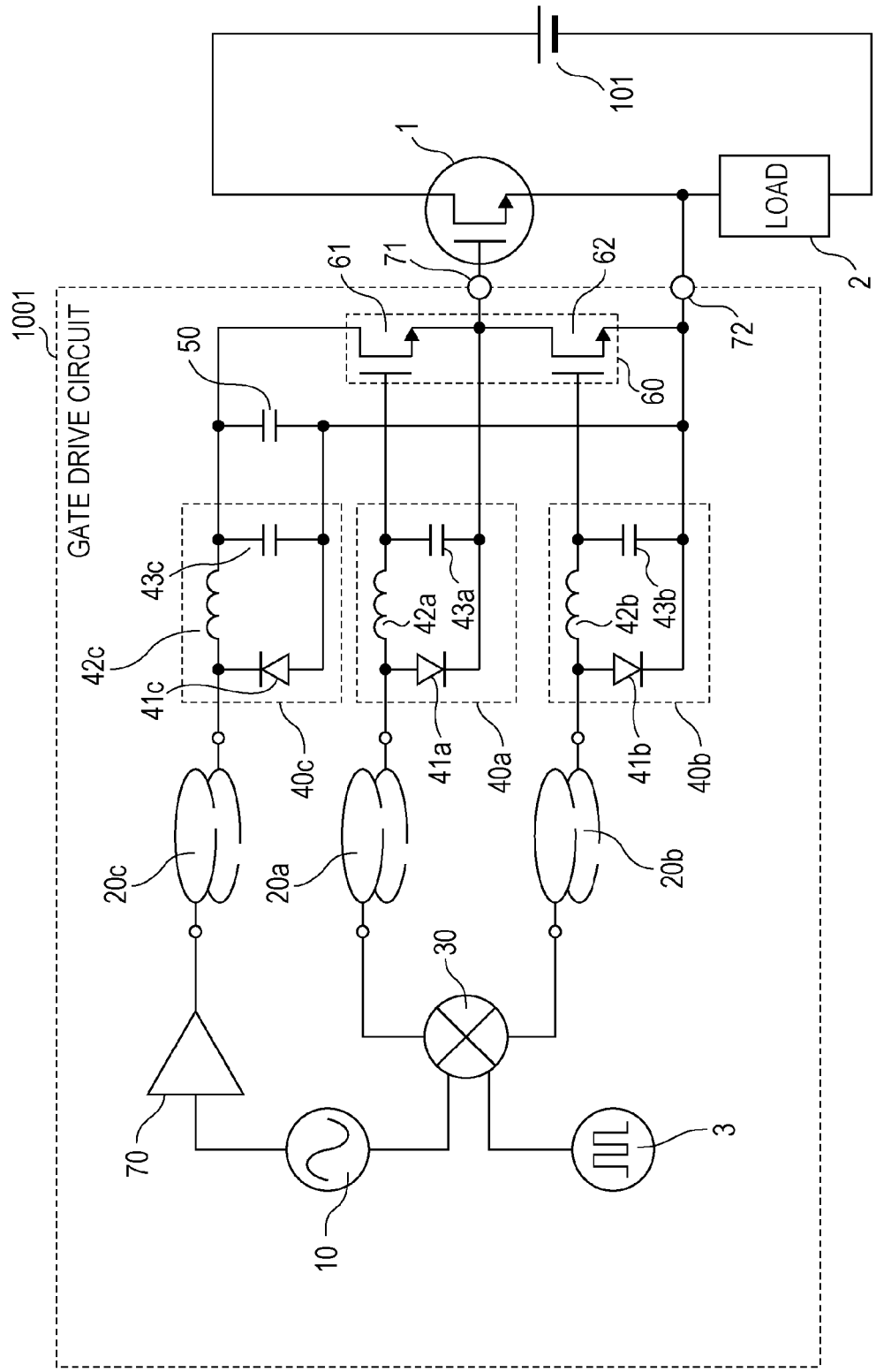
FIG. 10 is a circuit diagram illustrating a specific configuration example of the gate drive circuit according to the first embodiment.

Note that the gate drive circuit may further include an amplifier circuit to further increase current supplied to the gate terminal of the semiconductor switch 1. FIG. 10 is a circuit diagram illustrating a specific configuration of a gate drive circuit to which an amplifier circuit has been added. A gate drive circuit 1001 illustrated in FIG. 10 is the gate drive circuit 1000 to which an amplifier circuit 70 has been added.

The amplifier circuit 70 amplifies the radio-frequency wave generated by the radio-frequency oscillation circuit 10, and outputs it to the third electromagnetic resonance coupler 20c. The third electromagnetic resonance coupler 20c performs isolated transmission of the radio-frequency wave output from the amplifier circuit 70. The amplifier circuit 70 is, for example, a power amplifier for the radio-frequency wave.

Adding the amplifier circuit 70 enables a larger charge to be charged in the capacitor 50, meaning that the amplifier circuit 70 enables the capacitor 50 to be charged faster. That is to say, the gate drive circuit 1001 can instantaneously supply a large current to the semiconductor switch 1, thus realizing high-speed operations of the semiconductor switch 1.

It is acceptable that the maximum value of the amplitude of the second radio-frequency wave is greater than the maximum value of the amplitude of the second radio-frequency wave, for example, as a result of having added such an amplifier circuit 70. Specifically, it is acceptable that the amplitude of the second radio-frequency wave is greater than the second amplitude of the first modulated signal and the fourth amplitude of the second modulated signal.

Note that in the present disclosure, the amplifier circuit 70 can be deemed to be part of the radio-frequency generator. That is to say, the radio-frequency generator in the example illustrated in FIG. 10 includes the radio-frequency oscillation circuit 10 and the amplifier circuit 70. Note that the gate drive circuit 1001 does not have to include the radio-frequency oscillation circuit 10, as described earlier.

Figure 11:
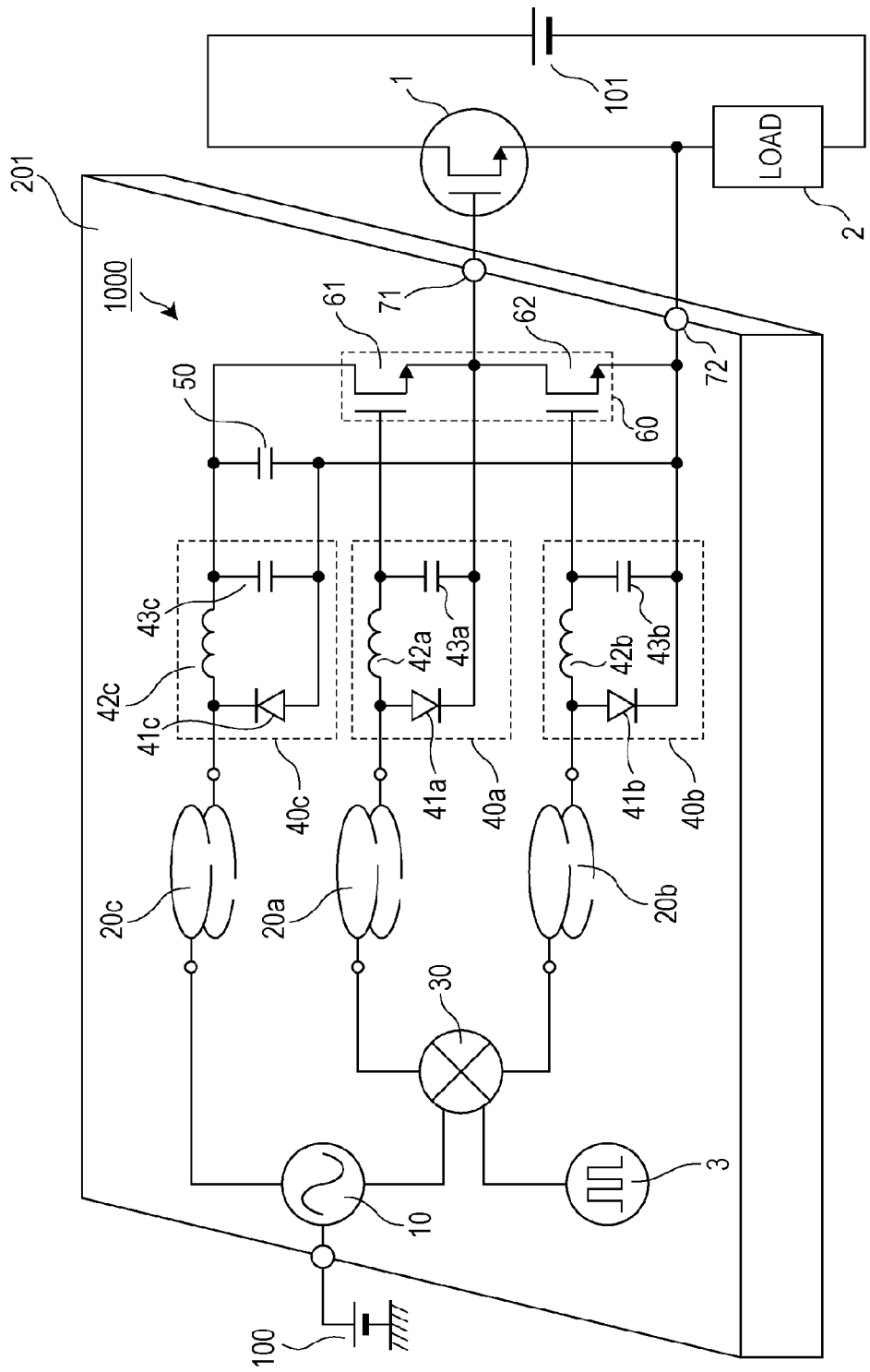
FIG. 11 is a diagram illustrating a specific configuration example of the gate drive circuit according to the first embodiment.

At least part of the gate drive circuit 1000 may be realized as an integrated circuit. FIG. 11 is a diagram illustrating a specific configuration example of the gate drive circuit 1000, realized as an integrated circuit. At least part of the gate drive circuit 1000 may be integrated as a semiconductor chip 201, as illustrated in FIG. 11. The semiconductor chip 201 may be a Si substrate, or a group III-V semiconductor substrate where a GaN semiconductor or the like has been provided on a sapphire substrate. Integrating the gate drive circuit 1000 simplifies assembly the module in which the gate drive circuit 1000 is included.

Second Embodiment

The gate drive circuit 1000 according to the first embodiment is capable of supplying a large current to the semiconductor switch 1 by charging a charge in the capacitor 50 and switching the switches. The gate drive circuit 1000 according to the first embodiment has three electromagnetic resonance couplers. Conversely, a gate drive circuit according to a second embodiment has a reduced number of electromagnetic resonance couplers, and can supply a large current to the semiconductor switch with a more simplified configuration.

Figure 12:
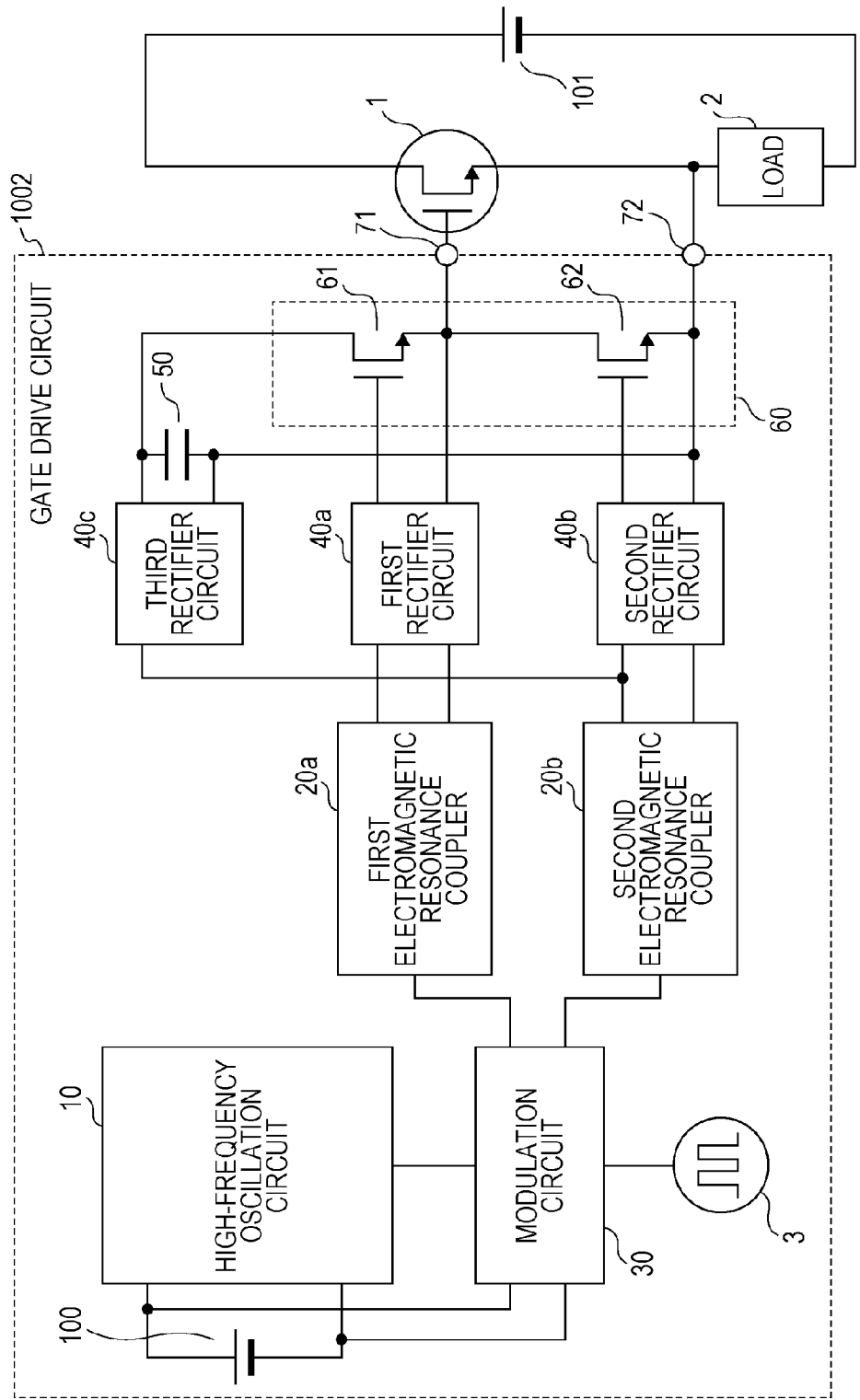
FIG. 12 is a system block diagram illustrating an example of a gate drive circuit according to a second embodiment.
Figure 13:
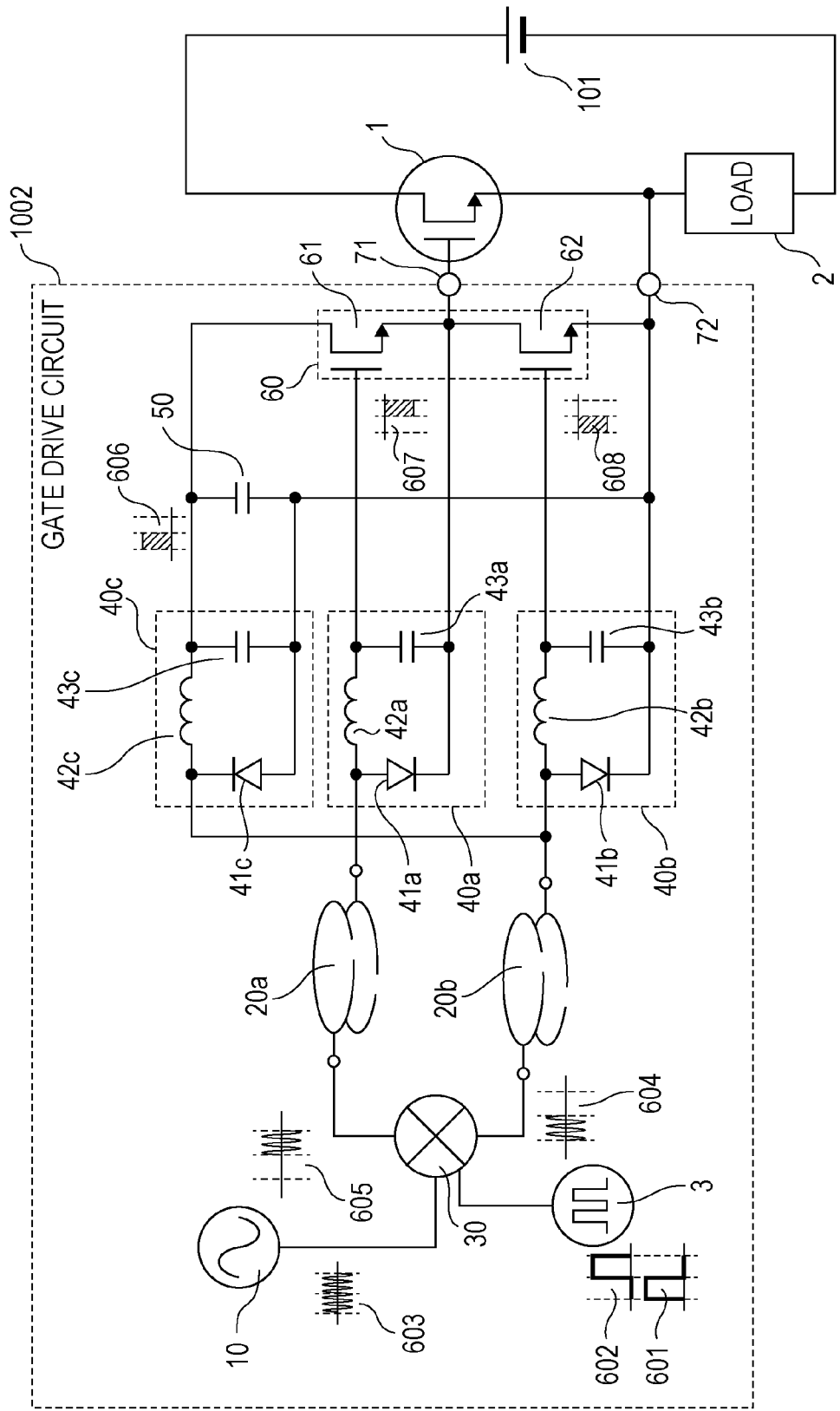
FIG. 13 is a circuit diagram illustrating a specific configuration example of the gate drive circuit according to the second embodiment.

The gate drive circuit according to the second embodiment will be described below with reference to the drawings. Description of the second embodiment will be made primarily regarding the points of difference as the first embodiment, and description of components which are substantially the same as those in the first embodiment may be omitted. FIG. 12 is a system block diagram illustrating an example of the gate drive circuit according to the second embodiment. FIG. 13 is a circuit diagram illustrating a specific configuration example of the gate drive circuit illustrated in FIG. 12.

The gate drive circuit 1002 includes the DC power source 100 and signal generator 3. The gate drive circuit 1002 also includes the radio-frequency oscillation circuit 10, modulation circuit 30, first electromagnetic resonance coupler 20a, and second electromagnetic resonance coupler 20b. The gate drive circuit 1002 further includes the first rectifier circuit 40a, second rectifier circuit 40b, third rectifier circuit 40c, capacitor 50, half bridge circuit 60, output terminal 71, and output reference terminal 72. The half bridge circuit 60 is configured including a first switch 61 and a second switch 62. Description will be made below regarding a case where the first switch 61 is the transistor 61 and the second switch 62 is the transistor 62.

The signal generator 3 generates an input signal, and outputs it to the modulation circuit 30. The input signal is equivalent to the control signal, and a driving signal to drive the semiconductor switch 1 is generated based on the control signal. The signal generator 3 includes a logic IC, for example. The input signal is a binary signal of high level and low level, as can be seen from waveform 601 and waveform 602 in FIG. 13, for example.

The radio-frequency oscillation circuit 10 generates a radio-frequency wave, and outputs the generated radio-frequency wave to the modulation circuit 30. The frequency of the radio-frequency wave may be 2.4 GHz or 5.8 GHz, or may be other frequencies. The radio-frequency wave may have waveform such as the waveform 603 illustrated in FIG. 13, for example. The radio-frequency oscillation circuit 10 may be, for example, a Colpitts oscillator, a Hartley oscillator, or some other oscillator which generates a microwave. The radio-frequency oscillation circuit 10 may include a frequency adjusting mechanism for cases where the frequency of radio-frequency wave fluctuates.

The modulation circuit 30 generates a first modulated signal and a second modulated signal. The first modulated signal has a waveform such as the waveform 605 illustrated in FIG. 13, for example. The second modulated signal has a waveform such as the waveform 604 illustrated in FIG. 13, for example. The modulation circuit 30 may be a differential mixer circuit or a switch circuit, for example.

The second modulated signal in the second embodiment includes a second radio-frequency wave. The second radio-frequency wave is the portion of the second modulated signal having amplitude to generate charging voltage, for example. In a case where the second modulated signal is generated by amplitude modulation of the first radio-frequency wave, the second radio-frequency wave has a frequency equivalent to that of the first radio-frequency wave.

The modulation circuit 30 outputs the first modulated signal to the first electromagnetic resonance coupler 20a, and outputs the second modulated signal to the second electromagnetic resonance coupler 20b. Description of the specific configurations of the first electromagnetic resonance coupler 20*a* and second electromagnetic resonance coupler 20*b*, will be omitted. The isolator in the second embodiment includes the first electromagnetic resonance coupler 20*a* and the second electromagnetic resonance coupler 20*b*.

After isolated transmission by the second electromagnetic resonance coupler 20*b*, the second modulated signal is split into two parts. Specifically, one part of the second modulated signal isolatedly transmitted by the second electromagnetic resonance coupler 20*b*, is rectified by the third rectifier circuit 40*c*. In other words, the third rectifier circuit 40*c* generates the third signal by rectifying a part of the second modulated signal isolatedly transmitted by the second electromagnetic resonance coupler 20*b*. The generated third signal charges the capacitor 50. The third signal has a waveform such as the waveform 606 in FIG. 13, for example.

In the example illustrated in FIG. 13, the third signal includes third on voltage and third off voltage, with the third on voltage being equivalent to the charging voltage. In a case where the second modulated signal includes a third amplitude, and a fourth amplitude larger than the third amplitude, as illustrated in FIG. 13, the third on voltage of the third signal corresponds to the fourth amplitude of the second modulated signal, and the third off voltage of the third signal corresponds to the third amplitude of the second modulated signal. In this case, the period of the fourth amplitude of the second modulated signal is equivalent to the second radio-frequency wave, the second radio-frequency wave being rectified to become the third on voltage, i.e., the charging voltage. Note that the third signal may include, besides the third on voltage, other voltage which can be the charging voltage, for example. In this case, the second radio-frequency wave includes signal components based on multiple different amplitudes.

The other part of the second modulated signal isolatedly transmitted by the second electromagnetic resonance coupler 20*b* is rectified by the second rectifier circuit 40*b*. The second rectifier circuit 40*b* generates the second signal by rectifying the other part of second modulated signal isolatedly transmitted by the second electromagnetic resonance coupler 20*b*. The second signal has a waveform such as the waveform 608 in FIG. 13, for example. The second signal is input to the transistor 62 included in the half bridge circuit 60 and drives the transistor 62.

That is to say, in the second embodiment, the second modulated signal is output from the second electromagnetic resonance coupler 20*b*, and is split into a part input to the second rectifier circuit 40*b* and the other part input to third rectifier circuit 40*c*. Accordingly, the second signal for output circuit 60 and the third signal for charging the capacitor 50 are both generated based on the second modulated signal.

The first modulated signal is isolatedly transmitted by the first electromagnetic resonance coupler 20*a*, and input to the first rectifier circuit 40*a* the first rectifier circuit 40*a* may be of a structure generally equal to that of the second rectifier circuit 40*b*.

The first rectifier circuit 40*a* generates the first signal by rectifying the first modulated signal. The first signal has a waveform such as the waveform 607 in FIG. 13, for example. The first signal is input to the transistor 61 included in the half bridge circuit 60 and drive the transistor 61.

The half bridge circuit 60 alternates between a state where the transistor 61 is on and the transistor 62 is off, and a state where the transistor 61 is off and the transistor 62 is on, in accordance with the first signal and the second signal, in the same way as with the first embodiment. Thus, the half bridge circuit 60 supplies the charge charged in the capacitor 50 to the semiconductor switch 1.

As described above, the gate drive circuit 1002 according to the second embodiment enables the number of electromagnetic resonance couplers, which occupy a large area in the gate drive circuit 1002, to be reduced. Accordingly, the circuit area of the gate drive circuit 1002 can be markedly reduced, and the circuit configuration can also be simplified. This simplifies mounting of circuit parts of the gate drive circuit 1002.

The radio-frequency oscillation circuit 10 of the gate drive circuit 1000 according to the first embodiment outputs the second radio-frequency wave to the third electromagnetic resonance coupler 20*c* regardless of whether the period where the transistor 61 is on and the transistor 62 is off, or the period where the transistor 61 is off and the transistor 62 is on. However, the capacitor 50 is not charged in the period where the transistor 62 is off, which is to say the period during which the charge charged in the capacitor 50 is being output from the output terminal 71. Accordingly, the radio-frequency oscillation circuit 10 does not have to output the second radio-frequency wave, which is the base for charging voltage of the capacitor 50, to the third electromagnetic resonance coupler 20*c* during this period.

The capacitor 50 is charged by the third signal based on the second modulated signal in the gate drive circuit 1002 according to the second embodiment. Accordingly, the capacitor 50 of the gate drive circuit 1002 is not charged during the period where the transistor 62 is off, i.e., during the period where the charge charged in the capacitor 50 is being output from the output terminal 71. Accordingly, the gate drive circuit 1002 according to the second embodiment can perform efficient charging.

That is to say, the third signal is generated based on the second modulated signal, the same as with the second signal. Accordingly, the period during which the transistor 62 is on in accordance with the second on voltage of the second signal and the period during which the capacitor 50 is charged in accordance with the third on voltage of the third signal can be synchronous. In the same way, the period during which the transistor 62 is off in accordance with the second off voltage of the second signal and the period during which the capacitor 50 is discharged in accordance with the third off voltage of the third signal can be synchronous. This allows charging voltage not to be supplied to the capacitor 50 during the period where the charge charged in the capacitor 50 is being output from the output terminal 71, and charging voltage to be supplied to the capacitor 50 during the period where the charge charged in the capacitor 50 is not being output from the output terminal 71. In other words, the third rectifier circuit 40*c* outputs charging voltage when the output circuit 60 does not supply the charge to the gate terminal of the semiconductor switch 1, and does not outputs charging voltage when the output circuit 60 does supplies the charge to the gate terminal of the semiconductor switch 1.

Figure 14:
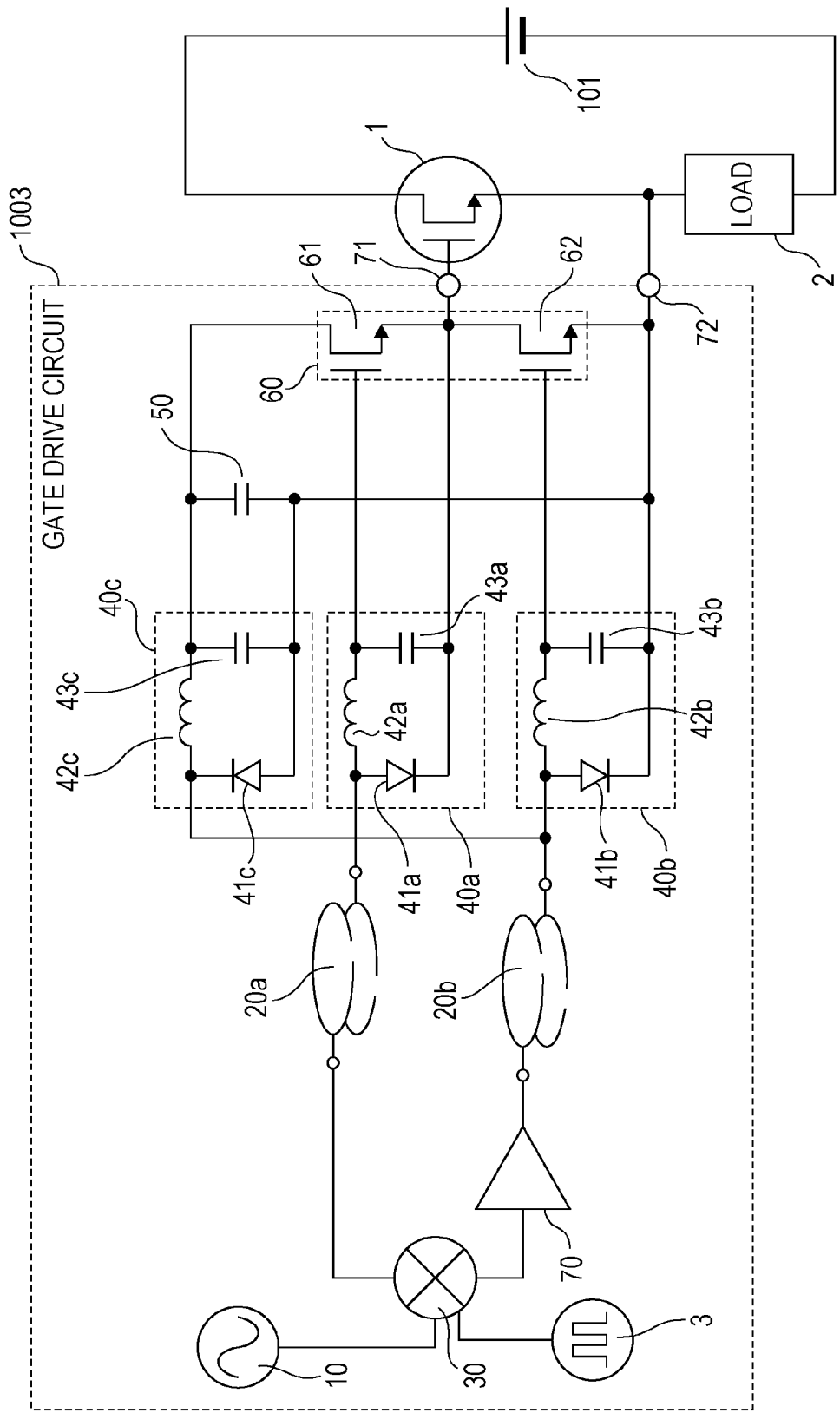
FIG. 14 is a circuit diagram illustrating a specific configuration example of the gate drive circuit according to the second embodiment.

Note that the gate drive circuit may further include an amplifier circuit to further increase current supplied to the gate terminal of the semiconductor switch 1. FIG. 14 is a circuit diagram illustrating a specific configuration of a gate drive circuit to which an amplifier circuit has been added. A gate drive circuit 1003 illustrated in FIG. 14 is the gate drive circuit 1002 to which the amplifier circuit 70 has been added.

The amplifier circuit 70 amplifies the second modulated signal and outputs it to the second electromagnetic resonance coupler 20*b*. The second electromagnetic resonance coupler 20*b* performs isolated transmission of the second modulated signal output from the amplifier circuit 70. The amplifier circuit 70 is, for example, a power amplifier for the radio-frequency wave.

Adding the amplifier circuit 70 enables a larger charge to be charged in the capacitor 50. The amplifier circuit 70 enables the capacitor 50 to be charged faster. That is to say, the gate drive circuit 1003 can supply a large current to the semiconductor switch 1, thus realizing high-speed operations of the semiconductor switch 1.

It is acceptable that the maximum value of the amplitude of the second modulated signal is greater than the maximum value of the amplitude of the first modulated signal, for example, as a result of having added such an amplifier circuit 70. Specifically, it is acceptable that the fourth amplitude of the second modulated signal is greater than the second amplitude of the first modulated signal.

Third Embodiment

The gate drive circuits according to the first and second embodiments have a half-bridge circuit as the output circuits, but the gate drive circuit according to a third embodiment has an H bridge circuit (i.e., full-bridge circuit) as the output circuit. The gate drive circuit according to the third embodiment will be described below with reference to the drawings.

Figure 15:
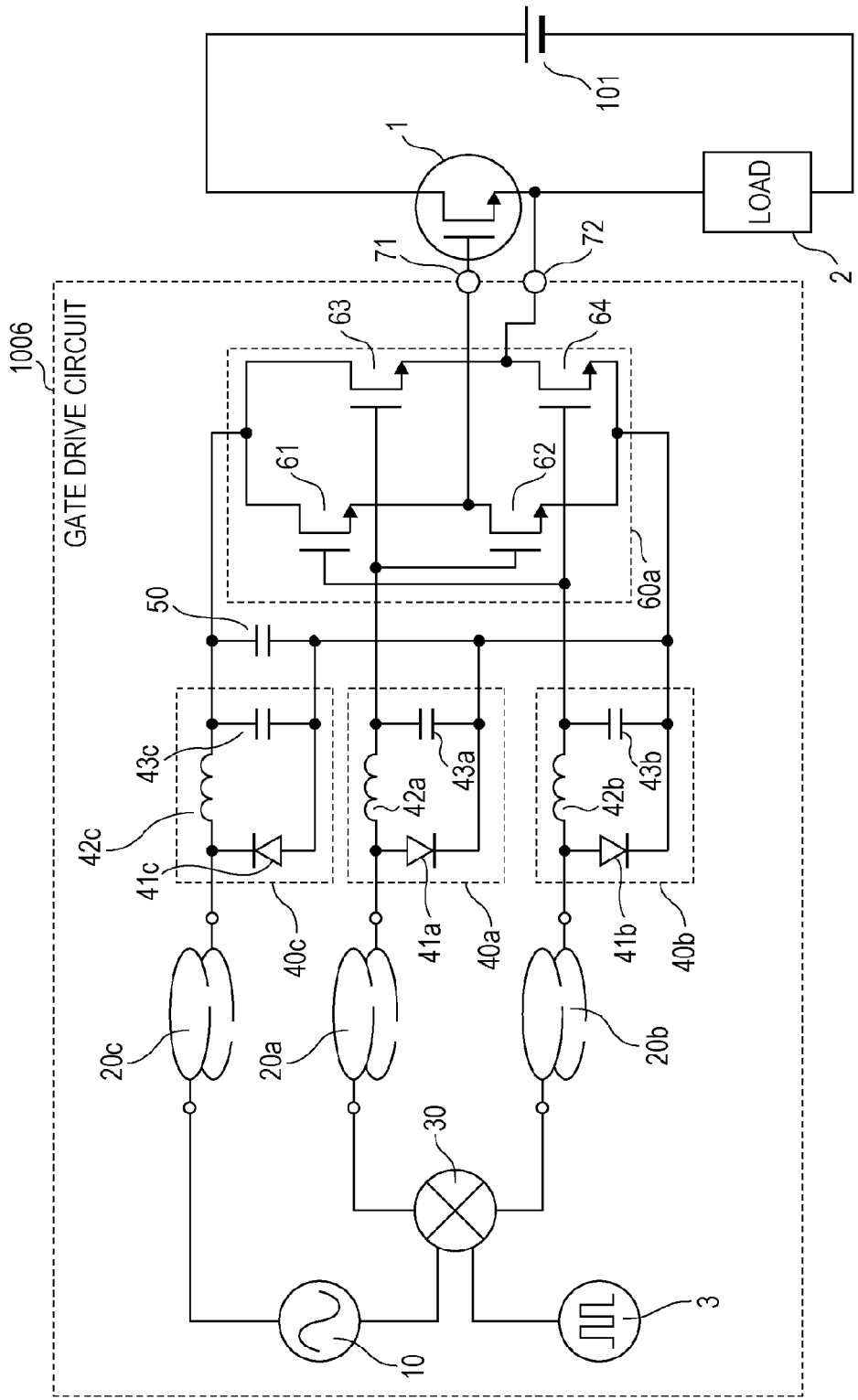
FIG. 15 is a circuit diagram illustrating a specific configuration example of a gate drive circuit according to a third embodiment.
Figure 16:
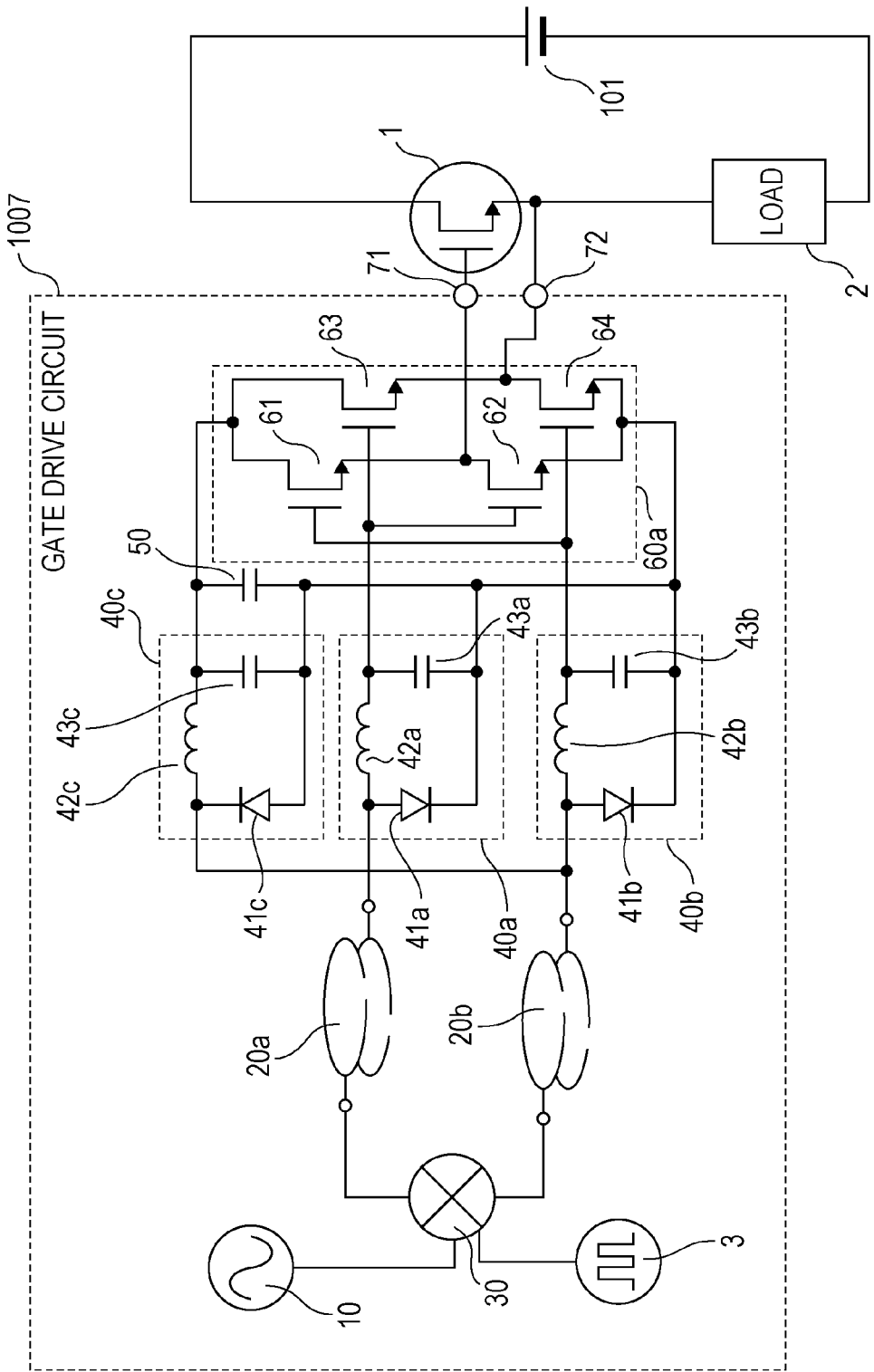
FIG. 16 is a circuit diagram illustrating a specific configuration example of the gate drive circuit according to the third embodiment.

FIG. 15 is a circuit diagram illustrating a specific configuration example of a gate drive circuit 1006 according to the third embodiment. The gate drive circuit 1006 differs from the gate drive circuit 1000 illustrated in FIG. 2 with regard to the point that an output circuit 60*a* is an H bridge circuit. FIG. 16 is a circuit diagram illustrating a specific configuration example of a gate drive circuit 1007 according to the third embodiment. The gate drive circuit 1007 differs from the gate drive circuit 1002 illustrated in FIG. 13 with regard to the point that an output circuit 60*a* is an H bridge circuit. Note that the configurations of the gate drive circuits 1006 and 1007 according to the third embodiment are the same as those of the first and second embodiments except for the H bridge circuit, so description will be partially omitted.

In a case where the semiconductor switch 1 is an IGBT or power metal-oxide-semiconductor field-effect transistor (MOSFET), for example, hardly any of the power supplied from the capacitor 50 to the semiconductor switch 1 is consumed as gate current. That is to say, in a case where the semiconductor switch 1 is an IGBT or MOSFET, the gate capacitance of the semiconductor switch 1 repeats charging and discharging of the charge.

However, in the gate drive circuits 1000 and 1002 having the half bridge circuit 60, the charge which has charged into the gate capacitance at the time of discharging the capacitor 50 (the state of FIG. 6B) is discharged to the ground via the load 2 in the subsequent charging time of the capacitor 50 (the state of FIG. 6A). Conversely, the gate drive circuits 1006 and 1007 have the H bridge circuit 60*a*, so the charge charged in the gate capacitance is charged into the capacitor 50 again.

The H bridge circuit 60*a* illustrated in FIGS. 15 and 16 includes a first switch 61, a second switch 62, a third switch 63, and a fourth switch 64. The first switch 61, second switch 62, third switch 63, and fourth switch 64 may respectively be the transistor 61, the transistor 62, a transistor 63, and a transistor 64. This is the arrangement which will be described below.

The transistor 62 extracts the charge from the gate terminal of the semiconductor switch 1 in accordance with the second signal. The drain terminal of the transistor 62 is connected to the output terminal 71 and the source terminal of the transistor 61, and the source terminal of the transistor 62 is connected to the source terminal of the transistor 64, the other end of the capacitor 50, the output reference node of the first rectifier circuit 40*a*, and the output reference node of the second rectifier circuit 40*b*. The gate terminal of the transistor 62 is connected to the output node of the first rectifier circuit 40*a*.

The transistor 63 operates in accordance with the second signal to extract the charge from the gate terminal of the semiconductor switch 1 in coordination with the transistor 62, and charges the extracted charge to the capacitor 50. The drain terminal of the transistor 63 is connected to the one end of the capacitor 50 and the drain terminal of the transistor 61, and the source terminal of the transistor 63 is connected to the output reference terminal 72 and the drain terminal of the transistor 64. The gate terminal of the transistor 63 is connected to the output node of the first rectifier circuit 40*a* and the gate terminal of the transistor 62.

The transistor 61 supplies the charge charged in the capacitor 50 to the first gate terminal of the semiconductor switch 1, in accordance with the first signal. The drain terminal of the transistor 61 is connected to the one end of the capacitor 50 and the drain terminal of the transistor 63, and the source terminal of the transistor 61 is connected to the output terminal 71 and the drain terminal of the transistor 62. The gate terminal of the transistor 61 is connected to the output node of the second rectifier circuit 40*b* and the gate terminal of the transistor 64.

The transistor 64 operates in accordance with the first signal, and supplies the charge charged in the capacitor 50 to the gate terminal of the semiconductor switch 1 in coordination with the transistor 61. The drain terminal of the transistor 64 is connected to the output terminal 71 and the source terminal of the transistor 63, and the source terminal of the transistor 64 is connected to the source terminal of the transistor 62, the other end of the capacitor 50, the output reference node of the first rectifier circuit 40*a*, and the output reference node of the second rectifier circuit 40*b*. the gate terminal of the transistor 64 is connected to the output node of the second rectifier circuit 40*b* and the gate terminal of the transistor 61.

This will be described in further detail. In the H bridge circuit 60*a*, the transistor 61 and transistor 64 are turned on and off at the same time, and the transistor 62 and the transistor 63 are turned on and off at the same time. For example, the transistor 61 and transistor 64 are turned on by the first on voltage of the first signal being input to the gate terminal of the transistor 61 and the gate terminal of the transistor 64. Accordingly, a current path is formed which passes through the capacitor 50, transistor 61, output terminal 71, gate capacitance of the semiconductor switch 1, output reference terminal 72, and transistor 64. The transistor 62 and transistor 63 are turned on by the second on voltage of the second signal being input to the gate terminal of the transistor 62 and the gate terminal of the transistor 63 in this example. Accordingly, a current path is formed which passes through the capacitor 50, transistor 63, output reference terminal 72, gate capacitance of the semiconductor switch 1, output terminal 71, and transistor 62.

In a case where the transistor 61 and transistor 64 are on, the charge discharged from the capacitor 50 is charged into the gate capacitance of the semiconductor switch 1. Note that the transistor 62 and transistor 63 are off at this time. On the other hand, in a case where the transistor 62 and transistor 63 are on, the charge is extracted from the gate capacitance of the semiconductor switch 1. However, unlike the case of a half-bridge circuit, the capacitor 50 and gate capacitance in the case of the H bridge circuit 60a are connected due to the transistor 62 and transistor 63 being on. The polarity of the capacitor 50 and the polarity of the gate capacitance are opposite at this time, so the charge is rapidly transported from the gate capacitance to the capacitor 50. That is to say, the charge charged in the gate capacitance is recovered to the capacitor 50 again, and charges the capacitor 50.

The gate drive circuits 1006 and 1007 using the H bridge circuit 60a can thus continue to use electric power whereby the capacitor 50 has once been charged. Accordingly, the gate drive circuits 1006 and 1007 can supply a large current to the semiconductor switch 1 without using power needlessly. That is to say, the gate drive circuits 1006 and 1007 can further reduce electric power consumption.

The transistors 61 through 64 may be GaN HFETs having a gate width of 4.8 mm and a gate length of 0.7 μm. The capacitor 50 may be a capacitor having capacitance of 200 nF. The input signal may be a 2 MHz rectangular wave.

Fourth Embodiment

The frequency of the second radio-frequency wave for supplying charging voltage to the capacitor 50, and the frequency of the first radio-frequency wave which is a carrier wave for sending the first signal and the second signal to the output circuit may be the same in the gate drive circuits according to the first through third embodiments, or may be different.

Conversely, a gate drive circuit according to a fourth embodiment uses the fundamental wave component of the radio-frequency wave to supply charging voltage to the capacitor 50, and uses the harmonic component to control the output circuit. Accordingly, a gate drive circuit with improved charging efficiency of the capacitor 50 and reduced size can be realized. That is to say, in the gate drive circuit according to the fourth embodiment, the fundamental component of the radio-frequency wave is the second radio-frequency wave, and the harmonic component of the radio-frequency wave is the first radio-frequency wave.

Figure 17:
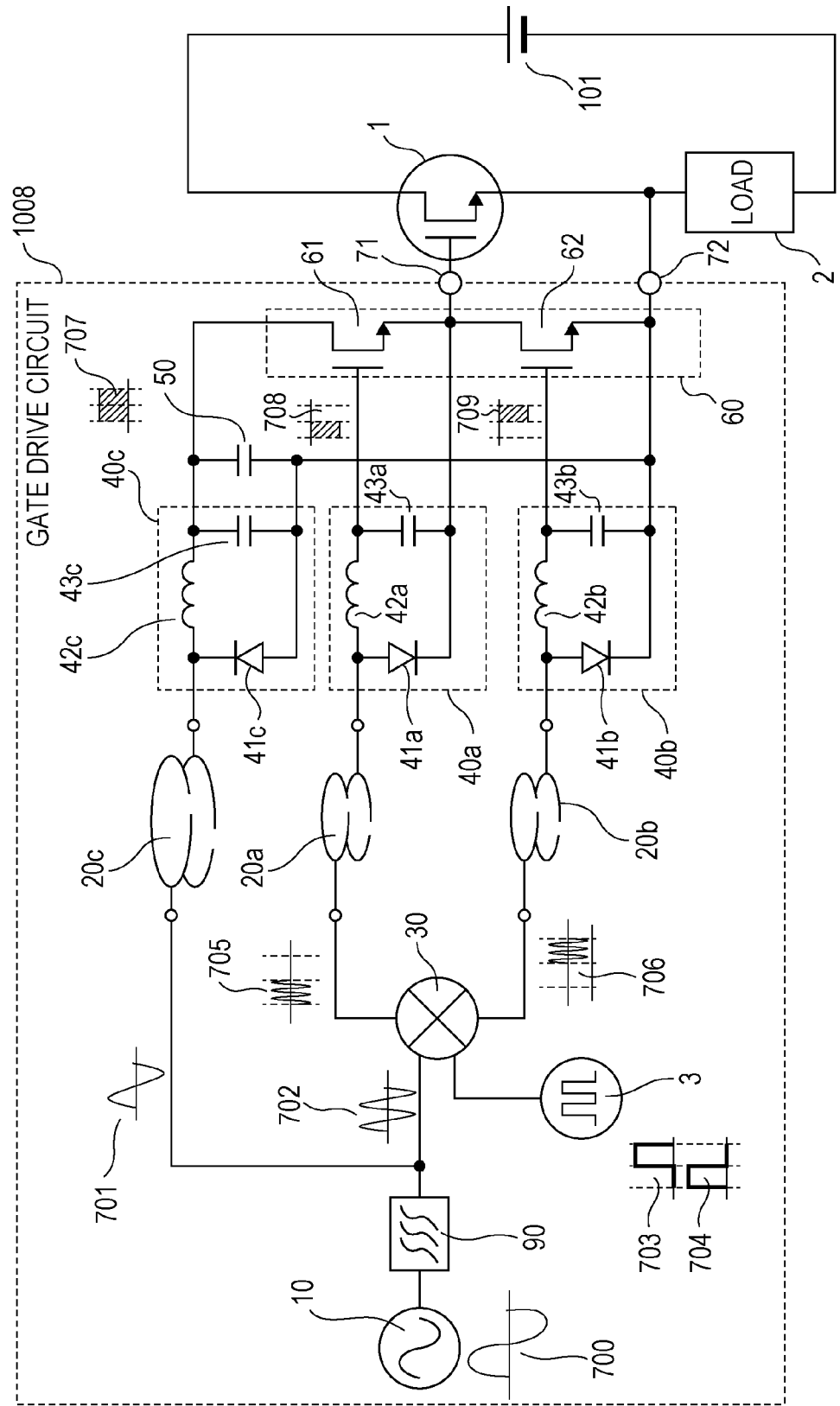
FIG. 17 is a circuit diagram illustrating a specific configuration example of a gate drive circuit according to a fourth embodiment.

The gate drive circuit according to the fourth embodiment will be described below with reference to the drawings. FIG. 17 is a circuit diagram illustrating a specific configuration example of a gate drive circuit according to the fourth embodiment.

A gate drive circuit 1008 includes the radio-frequency oscillation circuit 10, a frequency distribution filter 90, the modulation circuit 30, first electromagnetic resonance coupler 20a, second electromagnetic resonance coupler 20b, and third electromagnetic resonance coupler 20c. The gate drive circuit 1008 also includes the first rectifier circuit 40a, second rectifier circuit 40b, third rectifier circuit 40c, capacitor 50, half bridge circuit 60, output terminal 71, and output reference terminal 72.

The radio-frequency oscillation circuit 10 generates the radio-frequency wave. The radio-frequency oscillation circuit 10 may be, for example, a Colpitts oscillator, a Hartley oscillator, or some other oscillator which generates a microwave. Unless a single sine wave of a desired frequency, the radio-frequency wave output from the radio-frequency oscillation circuit 10 has distorted waveform including harmonics, such as second harmonic, third harmonic, and so forth.

The frequency distribution filter 90 splits the radio-frequency wave generated by the radio-frequency oscillation circuit 10 into the fundamental component and the harmonic component. The frequency distribution filter 90 is configured including an inductor and capacitor, for example. The frequency distribution filter 90 splits the input radio-frequency wave into fundamental component and second harmonic component, for example. The harmonic component is typically lower power as compared to the fundamental component.

Accordingly, in a case of the frequency distribution filter 90 outputting the fundamental component as the second radio-frequency wave and the harmonic component as the first radio-frequency wave, the amplitude of the second radio-frequency wave is larger than the amplitude of the first radio-frequency wave, for example. The following is a description with regard to a case where the harmonic component is a second harmonic component.

Note that the frequency distribution filter 90 can be deemed to be part of the radio-frequency generator in the present disclosure. That is to say, the radio-frequency generator includes the radio-frequency oscillation circuit 10 and frequency distribution filter 90 in the example illustrated in FIG. 17. As described earlier, the gate drive circuit 1008 does not have to include the radio-frequency oscillation circuit 10.

The gate width and the gate capacitance of the transistor 61 and transistor 62 are smaller in comparison with the semiconductor switch 1. Accordingly, the charge necessary for the transistor 61 and transistor 62 to be turned on is smaller than the charge necessary for the semiconductor switch 1 to be turned on. Accordingly, the transistor 61 and transistor 62 can be driven using the second harmonic component which is of lower power than the fundamental component.

Accordingly, the gate drive circuit 1008 uses the fundamental component as the second radio-frequency wave to charge the capacitor 50, and the second harmonic component as the first radio-frequency wave to supply the small current to the transistor 61 and transistor 62.

The second harmonic component is power unused by the gate drive circuits according to the first through third embodiments. The reason is that the electromagnetic resonance couplers only transmit predetermined frequency bands, so the second harmonic component of the radio-frequency wave is filtered out by the electromagnetic resonance couplers with frequency bands set so as to transmit the fundamental component.

The gate drive circuit 1008 thus improves the charging efficiency of the capacitor 50 by making effective use of power normally not used. The frequency of the fundamental component of the radio-frequency wave may be 2.4 GHz, for example. In this case, the frequency of the second harmonic component is 4.8 GHz. Note that the frequency of the radio-frequency wave is not restricted to such frequencies. Harmonic components other than the second harmonic component, such as third harmonic component, may be used as the harmonic component.

The fundamental component has a waveform such as the waveform 701 in FIG. 17, for example. The fundamental component split by the frequency distribution filter 90 is isolatedly transmitted by the third electromagnetic resonance coupler 20c. In other words, the second radio-frequency wave which the third electromagnetic resonance coupler isolatedly transmits in the gate drive circuit 1008 is the fundamental component which has been split by the frequency distribution filter 90.

On the other hand, the second harmonic component has a waveform such as the waveform 702 in FIG. 17, for example. The harmonic component split by the frequency distribution filter 90 is modulated by the modulation circuit 30 in accordance with the input signal. In other words, the radio-frequency wave modulated by the modulation circuit 30 in the gate drive circuit 1008 is the harmonic component split by the frequency distribution filter 90.

That is to say, the first modulated signal, whose waveform 705 is illustrated in FIG. 17, is generated by the harmonic component being modulated in accordance with the first input signal, whose waveform 704 is illustrated in FIG. 17. The second modulated signal, whose waveform 706 is illustrated in FIG. 17, is generated by the harmonic component being modulated in accordance with the second input signal, whose waveform 703 is illustrated in FIG. 17.

The first modulated signal generated by the modulation circuit 30 is then isolatedly transmitted by the first electromagnetic resonance coupler 20a, and the second modulated signal generated by the modulation circuit 30 is then isolatedly transmitted by the second electromagnetic resonance coupler 20b. On the other hand, the fundamental component which is the second radio-frequency wave is isolatedly transmitted by the third electromagnetic resonance coupler 20c. That is to say, the isolator in the fourth embodiment has the first electromagnetic resonance coupler 20a, the second electromagnetic resonance coupler 20b, and the third electromagnetic resonance coupler 20c.

Now, as described earlier regarding the electromagnetic resonance coupler 20, the length of lines of the resonators is dependent on the frequency of the signal to be transmitted, and the higher the frequency of the signal to be transmitted is, the shorter the length of the lines is. Accordingly, the resonator size of the third electromagnetic resonance coupler 20c which isolatedly transmits the fundamental component, the first electromagnetic resonance coupler 20a which isolatedly transmits the first modulated signal generated from the harmonics component, and the second electromagnetic resonance coupler 20b, which isolatedly transmits the second modulated signal generated from the harmonics component, greatly differ. A specific example of resonator size will be described below.

For example, the electromagnetic resonance coupler 20 may be fabricated on a substrate which has relative permittivity of 10. The resonator line length of the third electromagnetic resonance coupler which transmits the fundamental wave may be 16 mm. On the other hand, the resonator line length of the first electromagnetic resonance coupler 20a and second electromagnetic resonance coupler 20b, which transmit the harmonic component may be 8 mm. The isolation distance between resonators in the electromagnetic resonance coupler 20 may be 0.3 mm.

Thus, using the harmonic component enables the first electromagnetic resonance coupler 20a and second electromagnetic resonance coupler 20b of the gate drive circuit 1008 to be reduced in size. In a case of using third harmonic or higher harmonic component as the harmonic component of the gate drive circuit 1008 enables the size of the first electromagnetic resonance coupler 20a and second electromagnetic resonance coupler 20b to be further reduced. However, the power of the third harmonic component is even smaller than that of the second harmonic component, so there is a limit to transistors which can be driven using the third harmonic component. In this case, the size of the transistor 61 and transistor 62 of the half bridge circuit 60 may be small so that the half bridge circuit 60 can be switched using the third harmonic component, for example.

The first rectifier circuit 40a generates the first signal, whose waveform 708 is illustrated in FIG. 17, by rectifying the first modulated signal, whose waveform 705 is illustrated in FIG. 17, and the second rectifier circuit 40b generates the second signal, whose waveform 709 is illustrated in FIG. 17, by rectifying the second modulated signal, whose waveform 706 is illustrated in FIG. 17. The switching of the half bridge circuit 60 is controlled by the first signal and the second signal. The third rectifier circuit 40c generates the third signal, whose waveform 707 is illustrated in FIG. 17, by rectifying the fundamental component, whose waveform 701 is illustrated in FIG. 17. The third signal is used to charge the capacitor 50.

The circuit configuration of the first rectifier circuit 40a, second rectifier circuit 40b, and third rectifier circuit 40c may be the same as the first embodiment. Note however, that the first rectifier circuit 40a and second rectifier circuit 40b, and the third rectifier circuit 40c rectify different frequency radio-frequency waves, so constants relating to the properties of the circuit parts differ. For example, the inductance of the inductor 42a and inductor 42b may be 6 nH, and the inductance of the inductor 42c may be 3 nH. The capacitance of the capacitors 43a, 43b, and 43c may each be 10 pF. The constants for the inductors and capacitors may be other values as long as a short-circuit point can be formed at the output nodes of each of the first rectifier circuit 40a, second rectifier circuit 40b, and third rectifier circuit 40c.

Figure 18A:
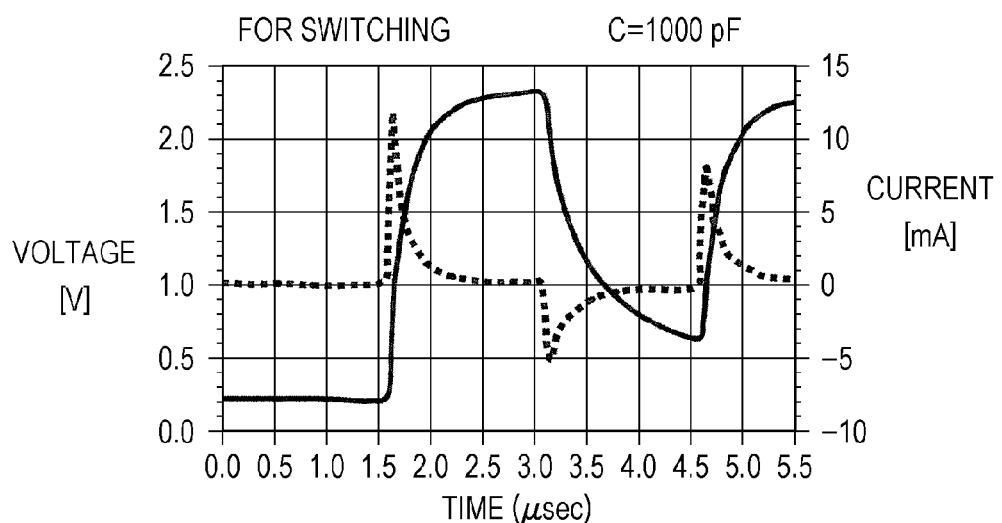
FIGS. 18A and 18B are diagrams illustrating operation examples of the gate drive circuit according to the fourth embodiment.
Figure 18B:
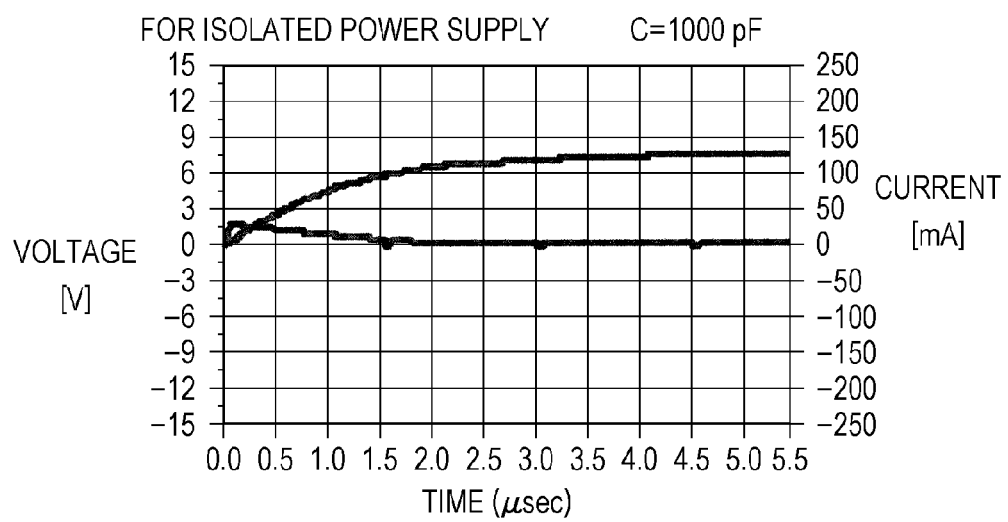

FIGS. 18A and 18B are diagrams illustrating simulation results of confirmation that the gate drive circuit 1008 operates. FIG. 18A is a diagram illustrating the waveform of the first signal input to the transistor 61 of the half bridge circuit 60 in the gate drive circuit 1008. In FIG. 18A, the solid line is the voltage waveform, and the dashed line is the current waveform. The second signal input to the transistor 62 of the half bridge circuit 60 also exhibits a similar waveform, though the on/off timing differs. The waveform illustrated in FIG. 18A relates to a case where a capacitive element having capacitance of 1000 pF is connected as the load of the gate drive circuit 1008. FIG. 18A illustrates that the first signal and second signal based on harmonic component with faint electric power can control switching of the half bridge circuit 60 in the gate drive circuit 1008.

FIG. 18B is a diagram illustrating the voltage at both ends of the capacitor 50 and the current flowing into the capacitor 50 of the gate drive circuit 1008, in a case of charging the capacitor 50 by the third signal based on the fundamental component. The curve in FIG. 18B which rises to approach 7 V represents the change of voltage over time. The curve which rises at around 0.1 μsec and thereafter drops to approach 0 mA represents the change of current over time. FIG. 18B illustrates that voltage of 7 V is applied to the capacitor 50 and also charge of 7 nC can be charged to the capacitor 50 by the third signal based on the fundamental component in the gate drive circuit 1008.

Figure 19:
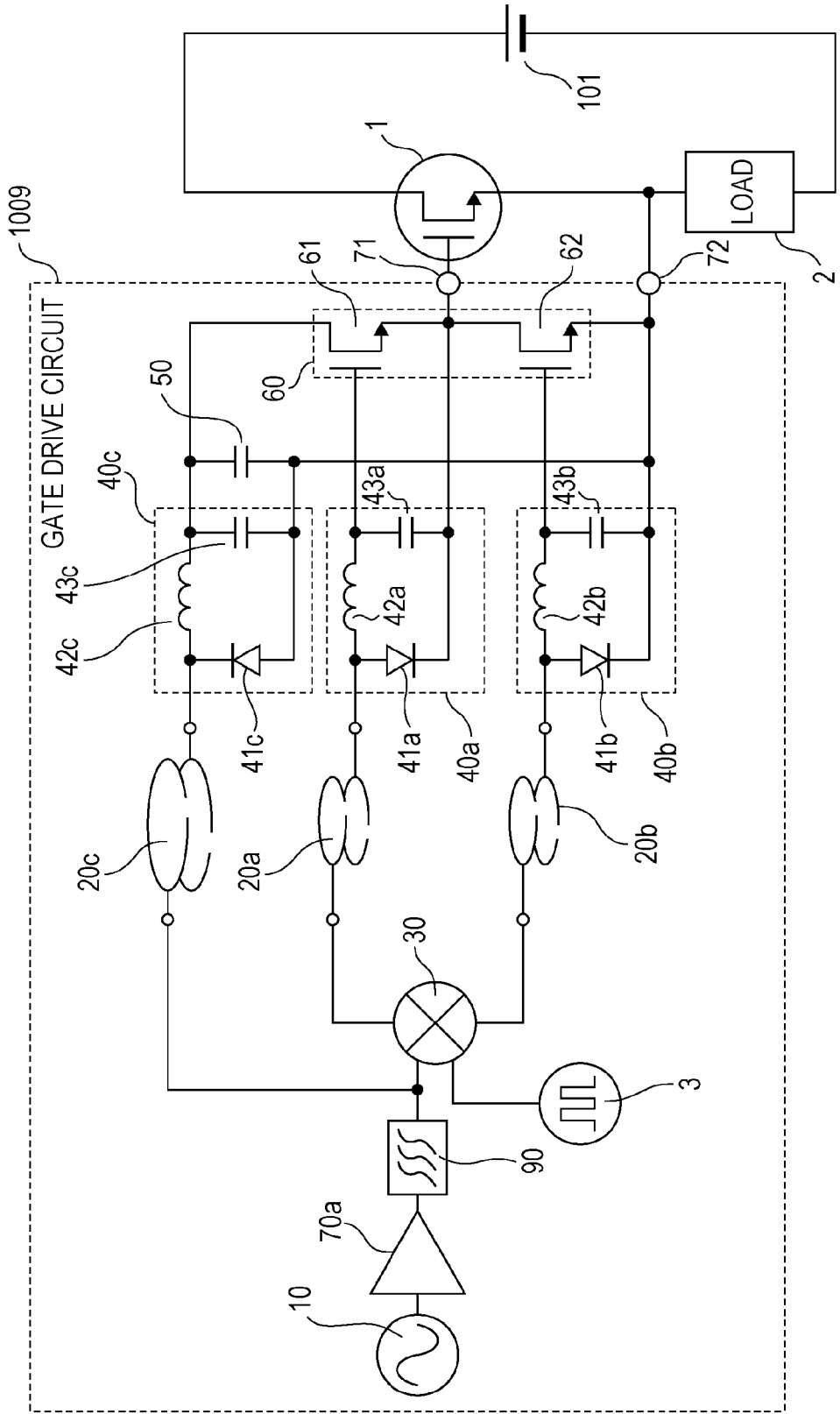
FIG. 19 is a circuit diagram illustrating a specific configuration example of the gate drive circuit according to the fourth embodiment.

Note that the gate drive circuit may further include an amplifier circuit to further increase current supplied to the gate terminal of the semiconductor switch 1. FIG. 19 is a circuit diagram illustrating a specific configuration of a gate drive circuit to which an amplifier circuit has been added. A gate drive circuit 1009 illustrated in FIG. 19 is the gate drive circuit 1008 to which an amplifier circuit 70a has been added.

The amplifier circuit 70a amplifies the radio-frequency wave generated by the radio-frequency oscillation circuit 10, and outputs it to the frequency distribution filter 90. The amplifier circuit 70a may be an amplifier with non-linearity, for example. Accordingly, the amplifier circuit 70a can amplify not only the fundamental component by also the harmonic component, so the first signal and second signal based on the harmonic component can control the switching of the half bridge circuit 60. The amplifier circuit 70*a* may be an amplifier with great non-linearity such as a C class amplifier, for example.

Due to this configuration, the amplifier circuit 70*a* can amplify not only the fundamental component for charging the capacitor 50, but also the harmonic component for controlling switching of the half bridge circuit 60. Accordingly, the gates of the transistor 61 and transistor 62 included in the half bridge circuit 60 can be made wider, for example. That is to say, the on-state resistance of the transistor 61 and transistor 62 can be reduced. Accordingly, the gate drive circuit 1009 can supply an even larger current to the semiconductor switch 1, by the amplifier circuit 70*a* amplifying the fundamental component. In a case where not only the fundamental component but the harmonic component also is amplified by the amplifier circuit 70*a*, switching loss at the half bridge circuit 60 can also be reduced.

Note that in the present disclosure, the amplifier circuit 70*a* can be deemed to be part of the radio-frequency generator. That is to say, the radio-frequency generator in the example illustrated in FIG. 19 includes the radio-frequency oscillation circuit 10, the amplifier circuit 70*a*, and the frequency distribution filter 90. Note that the gate drive circuit 1001 does not have to include the radio-frequency oscillation circuit 10, as described earlier.

Fifth Embodiment

The gate drive circuit 1000 according to the first embodiment supplies a large current to the semiconductor switch 1 by charging the capacitor 50 and switching the half bridge circuit 60. Now, the radio-frequency oscillation circuit 10 of the gate drive circuit 1000 according to the first embodiment constantly outputs the second radio-frequency wave to the third electromagnetic resonance coupler 20*c* regardless of whether the period where the transistor 61 is on and the transistor 62 is off, or the period where the transistor 61 is off and the transistor 62 is on, as illustrated in part (c) of FIG. 7. However, the capacitor 50 is not charged in the period where the transistor 62 is off, which is to say the period during which the charge charged in the capacitor 50 is being output from the output terminal 71. Accordingly, the radio-frequency oscillation circuit 10 does not have to output the second radio-frequency wave, which is the base for charging voltage of the capacitor 50, to the third electromagnetic resonance coupler 20*c* during this period.

The gate drive circuit according to the fifth embodiment therefore synchronizes operation of the radio-frequency oscillation circuit with the input signal, to conserve circuit power. The gate drive circuit according to the fifth embodiment will be described below with reference to the drawings.

Figure 20:
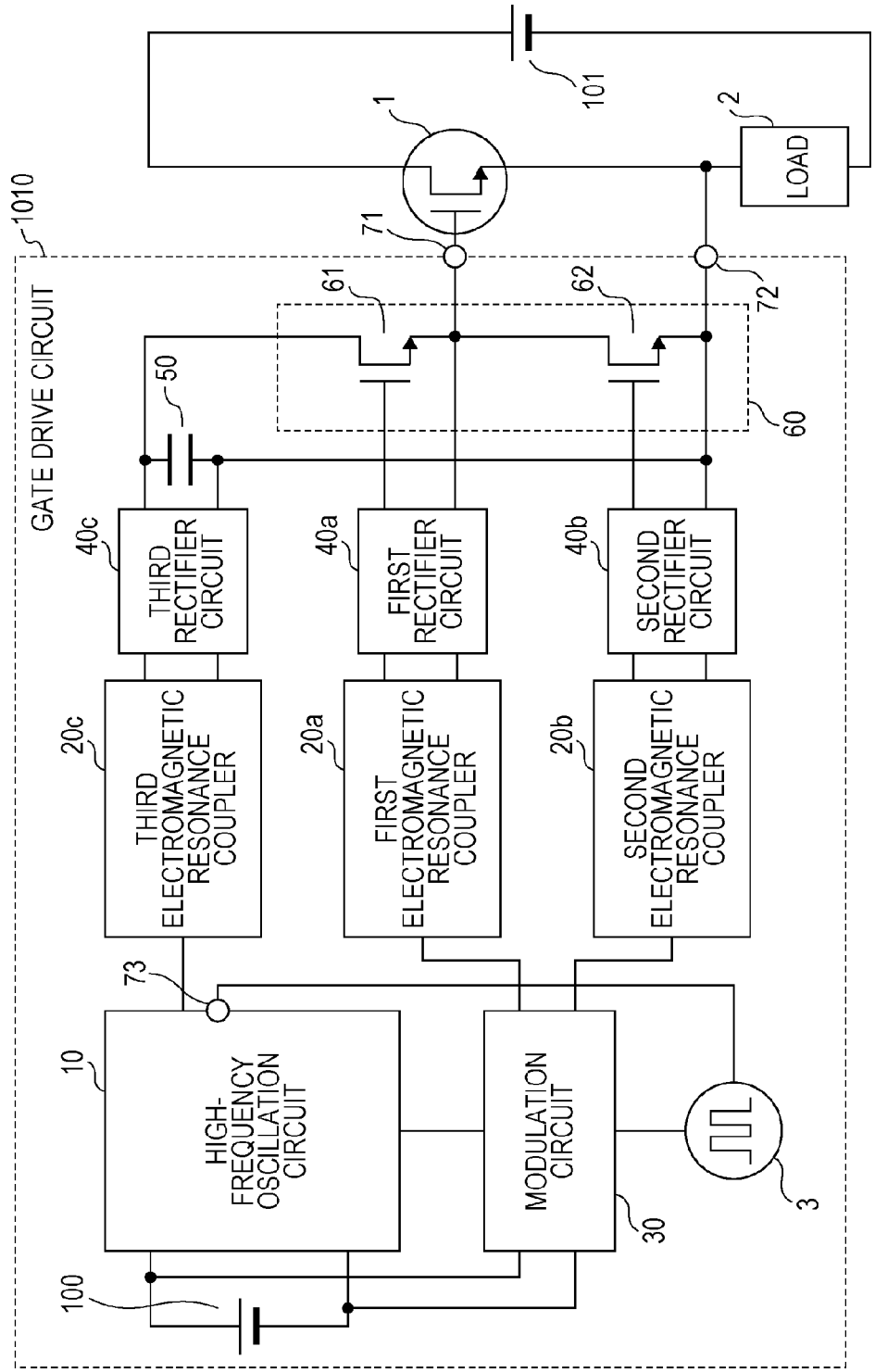
FIG. 20 is a system block diagram illustrating an example of a gate drive circuit according to a fifth embodiment.
Figure 21:
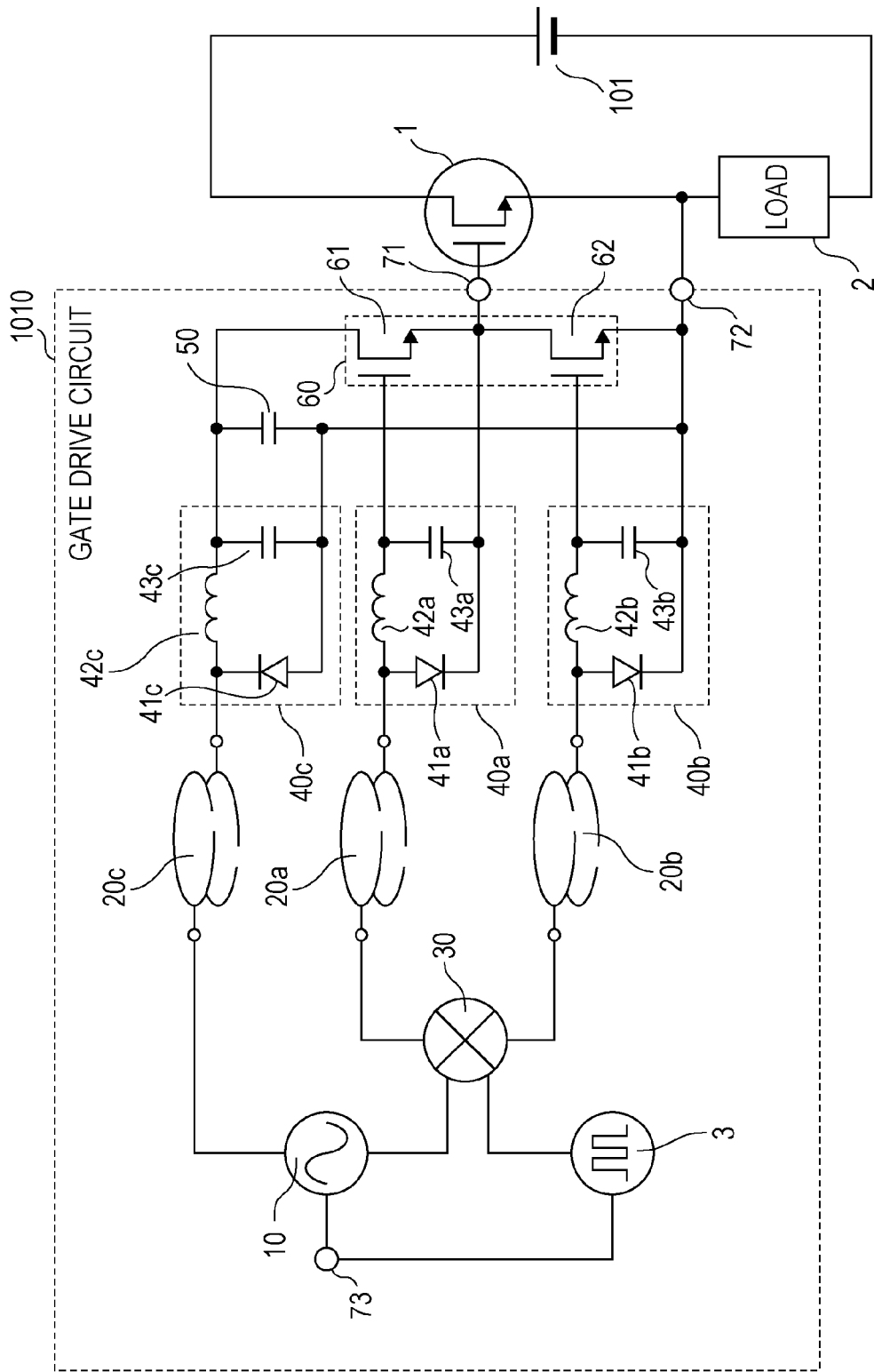
FIG. 21 is a circuit diagram illustrating a specific configuration example of the gate drive circuit according to the fifth embodiment.

FIG. 20 is a system block diagram illustrating an example of the gate drive circuit according to the fifth embodiment. FIG. 21 is a circuit diagram illustrating a specific configuration example of the gate drive circuit illustrated in FIG. 20. A gate drive circuit 1010 is of the same configuration as the gate drive circuit 1000 according to the first embodiment, so description will be made primarily regarding the points of difference.

The radio-frequency oscillation circuit 10 further includes a control terminal 73, and adjust the amplitude of the second radio-frequency wave generated for the third electromagnetic resonance coupler 20*c*, in accordance with a signal input to the control terminal 73. The signal is input from the signal generator 3 to the control terminal 73 in the examples illustrated in FIGS. 20 and 21. The radio-frequency oscillation circuit 10 then adjusts the amplitude of the second radio-frequency wave to be output to the third electromagnetic resonance coupler 20*c*, in accordance with the input signal input to the control terminal 73.

The capacitor 50 is not charged during the period when the semiconductor switch 1 is on. Accordingly, the radio-frequency oscillation circuit 10 adjusts the amplitude of the second radio-frequency wave output to the third electromagnetic resonance coupler 20*c* during this period to 0 V, for example. In this case, the radio-frequency oscillation circuit 10 does not output the second radio-frequency wave to the third electromagnetic resonance coupler 20*c*. Note that the period during which the semiconductor switch 1 is on corresponds to the period during which the first input signal exhibits the first high-level voltage.

On the other hand, the capacitor 50 is charged during the period when the semiconductor switch 1 is off. Accordingly, the radio-frequency oscillation circuit 10 adjusts the amplitude of the second radio-frequency wave output to the third electromagnetic resonance coupler 20*c* during this period to a predetermined value which is not 0 V. In this case, the radio-frequency oscillation circuit 10 outputs the second radio-frequency wave having a predetermined amplitude to the third electromagnetic resonance coupler 20*c*. Note that the period during which the semiconductor switch 1 is off corresponds to the period during which the first input signal exhibits the first low-level voltage.

Figure 22:
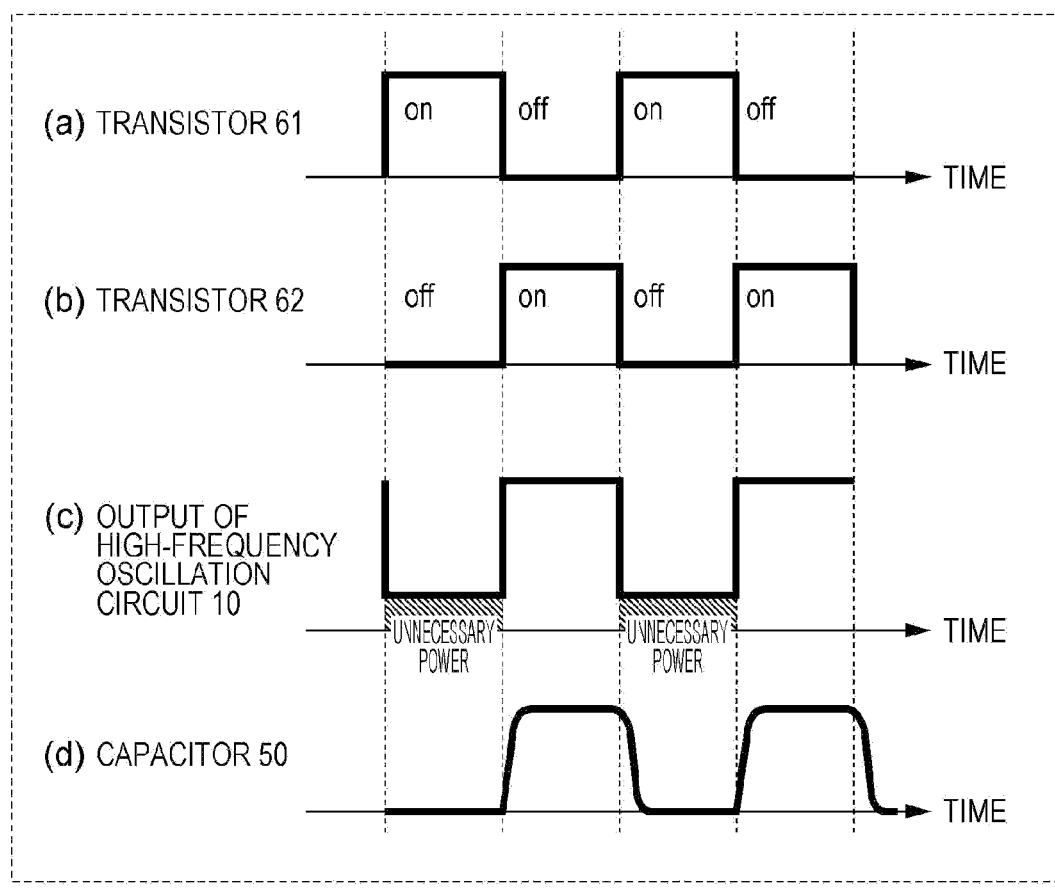
FIG. 22 is a diagram illustrating an example of the relationship between voltage across the gate/source of transistors included in the half bridge circuit, and electric charge that is charged to a capacitor, in the gate drive circuit according to the fifth embodiment.

FIG. 22 is a diagram illustrating an example of the relationship between voltage across the gate/source of the transistor 61 and transistor 62, and electric charge that is charged to the capacitor 50, in the gate drive circuit 1010. Note that part (c) of FIG. 22 illustrates the power which the radio-frequency oscillation circuit 10 outputs to the third electromagnetic resonance coupler 20*c*.

In a period where the transistor 61 is on and the transistor 62 is off, the radio-frequency oscillation circuit 10 does not supply power to the third electromagnetic resonance coupler 20*c*, as illustrated in part (c) of FIG. 22. Thus, the circuit conserves power in the gate drive circuit 1010. The radio-frequency oscillation circuit 10 outputs power to the third electromagnetic resonance coupler 20*c* when the transistor 62 is on, and does not output power to the third electromagnetic resonance coupler 20*c* when the transistor 62 is off, as illustrated in FIG. 22. Accordingly, the radio-frequency oscillation circuit 10 may adjust the amplitude of the second radio-frequency wave in accordance with the second input signal upon which are based the second signal which control the on/off of the transistor 62.

The control terminal 73 may be provided to the amplifier circuit 70 of gate circuits having the amplifier circuit 70, such as the gate drive circuit 1001 described in FIG. 10, the gate drive circuit 1003 described in FIG. 14, and so forth. Accordingly, the gate drive circuit can control the radio-frequency oscillation circuit 10 such as illustrated in FIG. 22.

Figure 23:
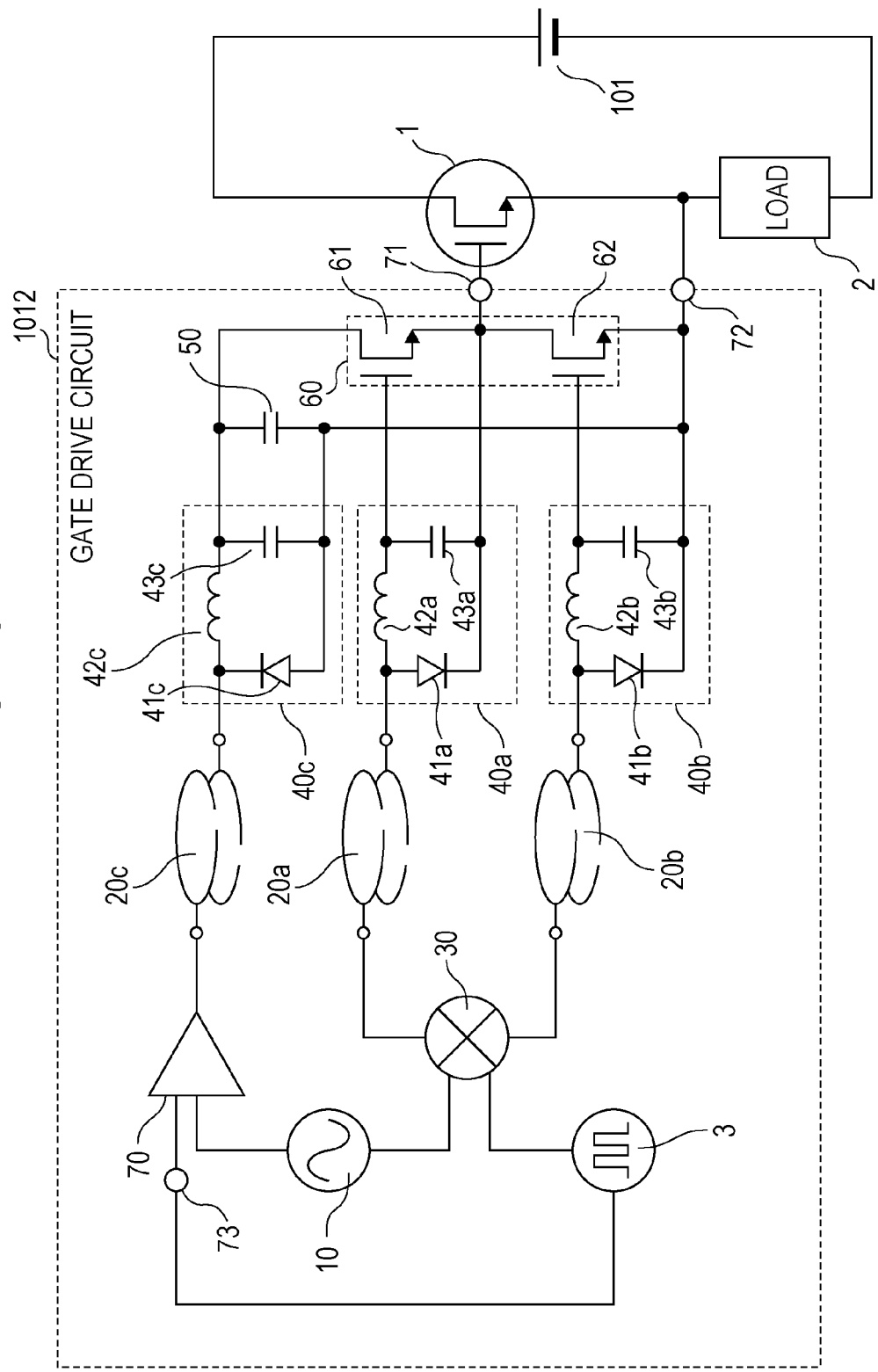
FIG. 23 is a circuit diagram illustrating a specific configuration example of the gate drive circuit according to the fifth embodiment.

FIG. 23 is a diagram illustrating a circuit configuration example where the control terminal 73 has been provided to the amplifier circuit of the gate drive circuit 1001 illustrated in FIG. 10. In this case, the amplifier circuit 70 is provided between the radio-frequency oscillation circuit 10 and the third electromagnetic resonance coupler 20*c*, so the amplifier circuit 70 does not affect the first radio-frequency wave output from the radio-frequency oscillation circuit 10 to the modulation circuit 30. Accordingly, the second radio-frequency wave to supply power to the capacitor 50 can be turned on/off without affecting the first radio-frequency wave to convey a signal for control of the half bridge circuit 60.

Figure 24:
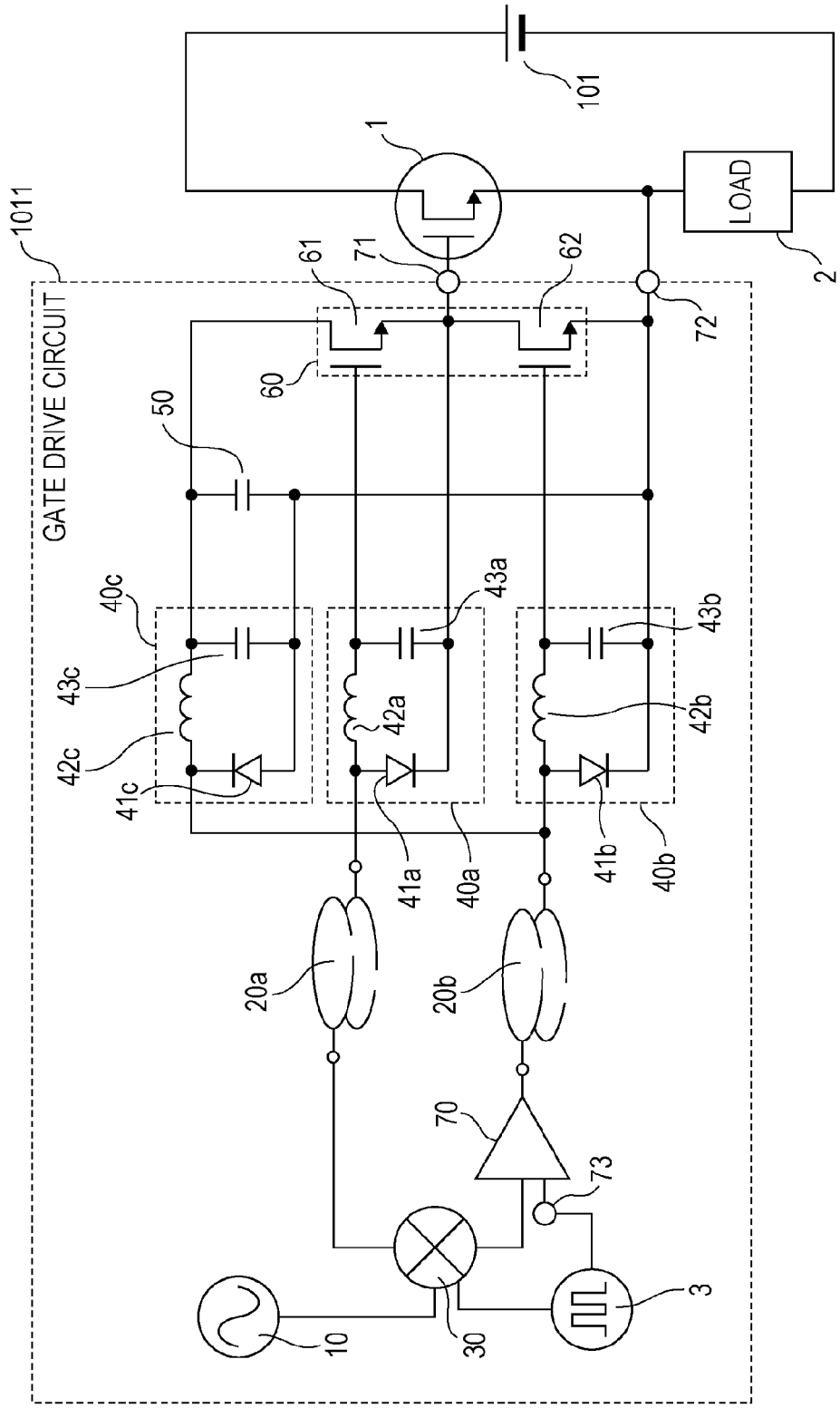
FIG. 24 is a circuit diagram illustrating a specific configuration example of the gate drive circuit according to the fifth embodiment.

FIG. 24 is a diagram illustrating a circuit configuration example of a case where the control terminal 73 has been provided to the amplifier circuit of the gate drive circuit 1003 illustrated in FIG. 14. The gate drive circuit 1012 illustrated in FIG. 23 and the gate drive circuit 1011 illustrated in FIG. 24 both can suppress unnecessary power.

Modifications

The isolator exemplified in the above-described first through fifth embodiments have at least a first electromagnetic resonance coupler and a second electromagnetic resonance coupler, since the first modulated signal serving as the base of the first signal, and the second modulated signal serving as the base of the second signal are isolatedly transmitted.

However, the number of electromagnetic resonance couplers which isolatedly transmit the modulated signals in the gate drive circuit can be reduced. For example, a gate drive circuit may include: a modulation circuit that generates a modulated signal by modulating a first radio-frequency wave in accordance with an input signal; an electromagnetic resonance coupler that isolatedly transmits the modulated signal; another electromagnetic resonance coupler that isolatedly transmits a second radio-frequency wave; a rectifier circuit that generates a signal by rectifying the modulated signal; a separate rectifier circuit that generates charging voltage by rectifying the second radio-frequency wave; a capacitor charged in accordance with the charging voltage; and an output circuit which selects whether or not to supply a charge charged in the capacitor to a gate terminal of the semiconductor switch, in accordance with the signal.

Such a circuit may be realized by the gate drive circuit 1000 illustrated in FIG. 2 having a configuration not including the second electromagnetic resonance coupler 20b, for example. An example of the gate drive circuit having such a configuration will be described blow. After isolated transmission by the first electromagnetic resonance coupler 20a, the first modulated signal is further split and input to the first rectifier circuit 40a and the second rectifier circuit 40b. The first rectifier circuit 40a rectifies the positive voltage component of the first modulated signal, and the second rectifier circuit 40b rectifies the negative voltage component of the first modulated signal. The first rectifier circuit 40a which rectifies the positive voltage component may be the first rectifier circuit 40a illustrated in FIG. 2 but with the diode 41a connected in reverse. A first signal generated by the first rectifier circuit 40a has a positive voltage component, and a second signal generated by the second rectifier circuit 40b has a negative voltage component. The first signal and the second signal have different polarities from each other, but the magnitude of the absolute values is synchronized. The first signal is input to a normally-off transistor 61 for example, and the second signal is input to a normally-on transistor 62 for example. Accordingly, during the period when predetermined voltage is input to the transistor 61 and transistor 62, the transistor 61 is on and the transistor 62 is off. Conversely, during the period when predetermined voltage is not input to the transistor 61 and transistor 62, the transistor 61 is off and the transistor 62 is on. Thus, the half bridge circuit 60 serves the same function as the half bridge circuit 60 illustrated in FIG. 1, and this gate drive circuit can also supply a large current to the semiconductor switch 1 by charging the capacitor 50 with a charge and switching the switch.

As another arrangement, a gate drive circuit may include: a modulation circuit that generates a modulated signal by modulating a first radio-frequency wave in accordance with an input signal; an electromagnetic resonance coupler that isolatedly transmits the modulated signal; a rectifier circuit that generates a signal by rectifying the modulated signal; a separate rectifier circuit that generates charging voltage by rectifying a second radio-frequency wave included in the modulated signal; a capacitor charged in accordance with the charging voltage; and an output circuit which selects whether or not to supply a charge charged in the capacitor to a gate terminal of the semiconductor switch, in accordance with the signal.

Such a circuit can be realized by the gate drive circuit 1000 illustrated in FIG. 13 having a configuration not including the second electromagnetic resonance coupler 20b, and second rectifier circuit 40b, for example. In this case, after being isolatedly transmitted by the first electromagnetic resonance coupler 20a, the first modulated signal may be split and input to the first rectifier circuit 40a and third rectifier circuit 40c. Also, the transistor 61 and transistor 62 of the output circuit 60 may be of a configuration to be turned on/off complementarily in response to one input signal, for example. The transistor 61 may be a normally-off P-type transistor 61, and the transistor 62 may be a normally-on N-type transistor 62, for example. Such a gate drive circuit can also supply a large current to the semiconductor switch 1 by charging the capacitor 50 with a charge and switching the switch.

Other gate drive circuits in the first through fifth embodiments described above may also be combined as suitable in the modifications.

Other Embodiments

The gate drive circuits according to the above-described first through fifth embodiments can instantaneously supply a large current to the semiconductor switch. Accordingly, semiconductor switches (e.g., IGBT and SiC FET) which conventionally have been difficult to drive by a gate drive circuit using electromagnetic resonance couplers can be driven.

Note that the circuit configurations in the above-described block diagrams and circuit diagrams are only exemplary, and the present disclosure is not restricted to the above-described circuit configurations. That is to say, circuits which can realize feature functions of the present disclosure in the same way as the above-described circuit configurations are also included in the present disclosure. For example, arrangements where a switch (e.g., transistor), resistive element, capacitive element, or other such devices are connected to a certain device, serially or in parallel, are also included in the present disclosure, provided that functions the same as those of the above-described circuit configuration can be realized. In other words, the term "connected" in the above-described embodiments is not restricted to a case of two terminals being directly connected. The term "connected" in the above-described embodiments includes cases where the two terminals are connected via a device, provided that functions the same as those of the above-described circuit configuration can be realized.

Also, in the present disclosure, expressions related to input/output of a signal are not restricted to cases of that signal being directly input/output, but rather also includes cases of being indirectly input/output. For example, expressions such as "a signal is output from A to B", "a signal is input from A to B", "a signal is output from A and input to B", and so forth, include configurations where another device or circuit is included between A and B. These expressions also include arrangements where a signal output from A has been changed by passing through another device or circuit, and then input to B.

It should be noted that the present disclosure is not restricted to these embodiments or modifications thereof. Modifications conceivable by one skilled in the art which are applied to the embodiments or modifications thereof, and combinations of components in different embodiments or modifications thereof, without departing from the essence of the present disclosure, are also encompassed in the scope of the present disclosure.

An example has been described in the above first through fifth embodiments where an input signal serving as a base for a modulated signal has information in difference in voltage values. However, the input signal is not restricted to this. The input signal may, for example, have information as the difference in duty ratio of pulse waves. For example, the input signal may be a PWM signal. A PWM signal is a signal where the magnitude in voltage amplitude of a predetermined waveform (e.g., sine wave) serving as a base of an input signal has been converted into the magnitude of pulse width. The PWM signal has a constant voltage amplitude and different duty ratios. Note that technology known in power source control and so forth can be applied to PWM operation.

An example has been described in the above first through fifth embodiments where the modulation circuit is a differential mixer or a switch circuit. However, the modulation circuit is not restricted to these. The modulation circuit may be of another configuration, as long as the radio-frequency wave and the input signal can be composited, or the radio-frequency wave can be modulated by the input signal.

As another example, a gate drive circuit to drive a semiconductor switch, may include: a modulation circuit that generates a first modulated signal by modulating a radio-frequency wave in accordance with an input signal, and a second modulated signal by modulating the radio-frequency wave in accordance with a different input signal from the first input signal; a first electromagnetic resonance coupler that isolatedly transmits the first modulated signal; a second electromagnetic resonance coupler that isolatedly transmits the second modulated signal; a first rectifier circuit that generates a first signal by rectifying the first modulated signal isolatedly transmitted from the first electromagnetic resonance coupler; a second rectifier circuit that generates a second signal by rectifying the second modulated signal isolatedly transmitted from the second electromagnetic resonance coupler; a capacitor; a third rectifier circuit that generates a third signal by rectifying a radio-frequency wave isolatedly transmitted by an electromagnetic resonance coupler provided to the gate drive circuit, and charges the capacitor with the generated third signal; and a driving circuit including at least one switch which supplies a charge charged in the capacitor to a gate terminal of the semiconductor switch, in accordance with the first signal and the second signal. Accordingly, the capacitor can be charged without providing a separate isolated power source, and a large current can be supplied to the semiconductor switch by the drive circuit.

As another example, the gate drive circuit may further include a third electromagnetic resonance coupler, with the electromagnetic resonance coupler being the third electromagnetic resonance coupler, and the third rectifier circuit generating the third signal by a rectifying radio-frequency wave isolatedly transmitted by the third electromagnetic resonance coupler.

As another example, frequency distribution filter may further be included which splits the radio-frequency wave into a fundamental signal including a fundamental component of the radio-frequency wave and a harmonic component including a harmonic component of the radio-frequency wave, where the radio-frequency wave which the modulation circuit modulates is the harmonic signal split by the frequency distribution filter, and the radio-frequency wave which the third electromagnetic resonance coupler isolatedly transmits is the fundamental signal split by the frequency distribution filter.

Accordingly, a harmonic signal which conventionally had not been used can be used for switching control of the drive circuit. Consequently, electric power efficiency for charging the capacitor can be improved. Thus, the amount of electric power used to charge the capacitor can be increased, and the switching speed of the semiconductor switch can further be increased.

As another example, an amplifier circuit may further be included which amplifies and outputs, to the third electromagnetic resonance coupler, the radio-frequency wave, with the third electromagnetic resonance coupler isolatedly transmitting the radio-frequency wave output from the amplifier circuit. Accordingly, the amount of power used for charging the capacitor can be further increased, and the switching speed of the semiconductor switch can be markedly increased.

As another example, a radio-frequency oscillation circuit may further be included which generates the radio-frequency wave which the modulation circuit modulates and the radio-frequency wave which the third electromagnetic resonance coupler isolatedly transmits.

As another example, the radio-frequency oscillation circuit may further include a control terminal which adjusts the amplitude of the radio-frequency wave generated as to the third electromagnetic resonance coupler in accordance with a signal input to the control terminal.

As another example, the input signal may be input to the control terminal, and the radio-frequency oscillation circuit may adjust the amplitude of the radio-frequency wave generated as to the third electromagnetic resonance coupler in accordance with the input signal input to the control terminal. Accordingly, radio-frequency wave can be output from the radio-frequency oscillation circuit only during the period of charging the capacitor, for example, and power of the gate drive circuit can be conserved.

As another example, the electromagnetic resonance coupler may be the second electromagnetic resonance coupler, with the third rectifier circuit generating the third signal by rectifying the second modulated signal. Accordingly, the number of electromagnetic resonance couplers is two, so the gate drive circuit can be simplified.

As another example, an amplifier circuit may further be included which amplifies the second modulated signal and outputs it to the second electromagnetic resonance coupler, where the second electromagnetic resonance coupler isolatedly transmits the second modulated signal output from the amplifier circuit. This enables the amount of electric power used to charge the capacitor to be increased, and the switching speed of the semiconductor switch can be further increased.

As another example, a radio-frequency oscillation circuit may further be included which generates a radio-frequency wave which the modulation circuit modulates.

As another example, the drive circuit may include a first switch that supplies a charge, charged in the capacitor, to the gate terminal of the semiconductor switch in accordance with the first signal, and a second switch that extracts a charge from the gate terminal in accordance with the second signal.

As another example, a large current can be supplied to the semiconductor switch by the drive circuit being configured as a so-called half-bridge circuit.

As another example, the drive circuit may further include a third switch which operates in accordance with the second signal to extract the charge from the gate terminal in coordination with the second switch, and charges the extracted charge to the capacitor, and a fourth switch which operates in accordance with the first signal to supply to the gate terminal the charge charged in the capacitor, in coordination with the first switch. Forming the driving circuit as a so-called H bridge circuit configuration in this way enables charge once supplied to the gate of the semiconductor switch to be recovered and charged to the capacitor again.

As another example, the modulation circuit may be, for example, a mixer circuit that generates the first modulated signal by mixing the input signal and radio-frequency wave so as to modulate the radio-frequency wave, and generates the second modulated signal by mixing a signal obtained by inverting the input signal and the radio-frequency wave so as to modulate the radio-frequency wave.

As another example, the modulation circuit may be, for example, a switch circuit that, by switching between whether to output the radio-frequency wave to the first electromagnetic resonance coupler or to the second electromagnetic resonance coupler, in accordance with the input signal, generates the first modulated signal by modulating the radio-frequency wave and the second modulated signal by modulating the radio-frequency wave.

As another example, at least part of the gate drive circuit may be realized as an integrated circuit. Accordingly, the size of the gate drive circuit can be reduced, and the number of procedures in mounting the circuit can be reduced.

The present disclosure is useful as a gate drive circuit which drives semiconductor switches such as IGBTs and SiC FETs which handle a large current, for example.

While the present disclosure has been described with respect to exemplary embodiments thereof, it will be apparent to those skilled in the art that the disclosure may be modified in numerous ways and may assume many embodiments other than those specifically described above. Accordingly, it is intended by the appended claims to cover all modifications of the disclosure that fall within the true spirit and scope of the disclosure.

What is claimed is:

1. A gate drive circuit comprising:
   a modulation circuit that generates a first modulated signal by modulating a first radio-frequency wave in accordance with a first input signal, and a second modulated signal by modulating the first radio-frequency wave in accordance with a second input signal different from the first input signal;
   an isolator that includes a plurality of electromagnetic resonance couplers, the plurality of electromagnetic resonance couplers including a first electromagnetic resonance coupler that isolatedly transmits the first modulated signal and a second electromagnetic resonance coupler that isolatedly transmits the second modulated signal;
   a first rectifier circuit that generates a first signal by rectifying the first modulated signal transmitted from the first electromagnetic resonance coupler;
   a second rectifier circuit that generates a second signal by rectifying at least a part of the second modulated signal transmitted from the second electromagnetic resonance coupler;
   a third rectifier circuit that generates charging voltage by rectifying a second radio-frequency wave isolatedly transmitted by one of the plurality of electromagnetic resonance couplers;
   a capacitor that charges a charge in accordance with the charging voltage; and
   an output circuit which selects whether or not to supply the charge charged in the capacitor to a gate terminal of a semiconductor switch, in accordance with at least one of the first signal and the second signal.

2. The gate drive circuit according to claim 1, wherein the plurality of electromagnetic resonance couplers further include a third electromagnetic resonance coupler that isolatedly transmits the second radio-frequency wave.

3. The gate drive circuit according to claim 2, wherein a maximum value of amplitude of the second radio-frequency wave is larger than a maximum value of amplitude of the first modulated signal and the second modulated signal.

4. The gate drive circuit according to claim 2, further comprising:
   a radio-frequency wave generator that generates the first radio-frequency wave and the second radio-frequency wave.

5. The gate drive circuit according to claim 4, wherein the radio-frequency wave generator includes a frequency distribution filter which splits a radio-frequency wave into a fundamental component and a harmonic component, outputs the fundamental component as the second radio-frequency wave, and outputs the harmonic component as the first radio-frequency wave.

6. The gate drive circuit according to claim 4, wherein the radio-frequency wave generator includes an amplifier circuit that changes the amplitude of the second radio-frequency wave.

7. The gate drive circuit according to claim 6, wherein:
   the radio-frequency wave generator further includes a control terminal;
   the amplifier circuit changes the amplitude of the second radio-frequency wave in accordance with a signal input to the control terminal; and
   the third rectifier circuit outputs the charging voltage when the output circuit does not supply the charge to the gate terminal of the semiconductor switch, and does not output the charging voltage when the output circuit supplies the charge to the gate terminal of the semiconductor switch.

8. The gate drive circuit according to claim 1, wherein:
   the second modulated signal includes the second radio-frequency wave;
   the second rectifier circuit generates the second signal by rectifying a part of the second modulated signal transmitted from the second electromagnetic resonance coupler; and
   the third rectifier circuit generates the charging voltage by rectifying the second radio-frequency wave included in another part of the second modulated signal isolatedly transmitted from the second electromagnetic resonance coupler.

9. The gate drive circuit according to claim 8, wherein a maximum value of amplitude of the second modulated signal is larger than a maximum value of amplitude of the first modulated signal.

10. The gate drive circuit according to claim 8, further comprising:

an amplifier circuit that amplifies the second modulated signal, the amplifier circuit disposed between the modulation circuit and the second electromagnetic resonance coupler.

11. The gate drive circuit according to claim 8, further comprising:
a radio-frequency oscillation circuit that generates the first radio-frequency wave.

12. The gate drive circuit according to claim 8, wherein the third rectifier circuit outputs the charging voltage when the output circuit does not supply the charge to the gate terminal of the semiconductor switch, and does not output the charging voltage when the output circuit supplies the charge to the gate terminal of the semiconductor switch.

13. The gate drive circuit according to claim 1, wherein the output circuit includes:
a first switch that supplies the charge charged in the capacitor to the gate terminal of the semiconductor switch in accordance with the first signal; and
a second switch that extracts a charge from the gate terminal of the semiconductor switch in accordance with the second signal.

14. The gate drive circuit according to claim 1, wherein the output circuit includes:
a first switch and a fourth switch that supply the charge charged in the capacitor to the gate terminal of the semiconductor switch in accordance with the first signal, and
a second switch and a third switch that extract a charge from the gate terminal of the semiconductor switch and then charge the charge to the capacitor, in accordance with the second signal.

15. The gate drive circuit according to claim 1, wherein the modulation circuit includes a mixer circuit that generates the first modulated signal by mixing the first input signal and the first radio-frequency wave, and generates the second modulated signal by mixing the second input signal and the first radio-frequency wave.

16. The gate drive circuit according to claim 1, wherein the second input signal is an inverted signal of the first input signal.

17. The gate drive circuit according to claim 1, wherein the modulation circuit is a switch circuit that generates the first modulated signal and the second modulated signal, by switching between whether to output the first radio-frequency wave to the first electromagnetic resonance coupler or to the second electromagnetic resonance coupler, in accordance with the first input signal and the second input signal.

18. A gate drive circuit comprising:
a modulation circuit that generates a modulated signal by modulating a first radio-frequency wave in accordance with an input signal;
an isolator that includes an electromagnetic resonance coupler that isolatedly transmits the modulated signal;
a rectifier circuit that generates a signal by rectifying the modulated signal transmitted from the electromagnetic resonance coupler;
another rectifier circuit that generates charging voltage by rectifying a second radio-frequency wave isolatedly transmitted by the isolator;
a capacitor that charges a charge in accordance with the charging voltage; and
an output circuit which selects whether or not to supply the charge charged in the capacitor to a gate terminal of a semiconductor switch, in accordance with the signal.

19. The gate drive circuit according to claim 18, wherein:
the modulated signal includes the second radio-frequency wave; and
the another rectifier circuit generates the charging voltage by rectifying the second radio-frequency wave isolatedly transmitted from the electromagnetic resonance coupler.

20. The gate drive circuit according to claim 18, wherein the isolator further includes another separate electromagnetic resonance coupler that isolatedly transmits the second radio-frequency wave.

* * * * *